(12) United States Patent
Harada et al.

(10) Patent No.: US 8,728,935 B2
(45) Date of Patent: May 20, 2014

(54) METHOD OF MANUFACTURING SEMICONDUCTOR DEVICE, METHOD OF PROCESSING SUBSTRATE AND SUBSTRATE PROCESSING APPARATUS

(75) Inventors: Kazuhiro Harada, Toyama (JP); Hideharu Itatani, Toyama (JP); Sadayoshi Horii, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 345 days.

(21) Appl. No.: 12/974,884

(22) Filed: Dec. 21, 2010

(65) Prior Publication Data

US 2011/0151660 A1 Jun. 23, 2011

(30) Foreign Application Priority Data

Dec. 22, 2009 (JP) ................. 2009-290835
Oct. 1, 2010 (JP) ................. 2010-223939

(51) Int. Cl.
*H01L 21/44* (2006.01)

(52) U.S. Cl.
USPC .................... 438/652; 438/656; 257/E21.295

(58) Field of Classification Search
USPC ......................................... 438/652
See application file for complete search history.

(56) References Cited

U.S. PATENT DOCUMENTS

| 2002/0001906 A1* | 1/2002 | Park ......................... 438/287 |
| 2005/0275944 A1* | 12/2005 | Wang et al. .................. 359/576 |
| 2008/0116437 A1* | 5/2008 | Oh et al. ..................... 257/2 |
| 2009/0065873 A1* | 3/2009 | Park et al. .................... 257/372 |
| 2009/0233429 A1 | 9/2009 | Ishikawa et al. |
| 2009/0325372 A1* | 12/2009 | Harada ......................... 438/591 |

FOREIGN PATENT DOCUMENTS

| JP | 2008-192914 A | 8/2008 |
| JP | 2009-194339 A | 8/2009 |
| JP | 2010-034511 A | 2/2010 |
| KR | 10-0773751 B1 | 10/2007 |
| WO | 2007132884 A1 | 11/2007 |

* cited by examiner

*Primary Examiner* — Daniel Whalen
*Assistant Examiner* — Shaka White
(74) *Attorney, Agent, or Firm* — Volpe and Koenig, P.C.

(57) ABSTRACT

A method of manufacturing a semiconductor device capable of minimally preventing the property deterioration caused by the oxidation of a metal film, and a substrate processing apparatus are provided. The method of manufacturing a semiconductor device includes: (a) loading a substrate into a processing container; (b) forming a metal film on the substrate using a chemical deposition method by supplying a processing gas into the processing container and exhausting the processing gas; (c) forming an aluminum nitride film on the metal film using the chemical deposition method by supplying an aluminum-containing source gas and a nitrogen-containing gas into the processing container and exhausting the aluminum-containing source gas and the nitrogen-containing gas; and (d) unloading the substrate from the processing container after forming the metal film and the aluminum nitride film, wherein the step (b) and the step (c) are continuously performed while maintaining an inside of the processing container to have an oxygen-free atmosphere.

8 Claims, 13 Drawing Sheets

//METHOD OF MANUFACTURING SEMICONDUCTOR DEVICE, METHOD OF PROCESSING SUBSTRATE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-290835, filed on Dec. 22, 2009, and Japanese Patent Application No. 2010-223939, filed on Oct. 1, 2010, in the Japanese Patent Office, the entire contents of which are hereby incorporated by reference.

BACKGROUND OF THE INVENTION

1. Field of the Invention

The present invention relates to a method of manufacturing a semiconductor device including processing a substrate in a processing container, a method of processing a substrate, and a substrate processing apparatus which may be suitably used for the processing of the substrate.

2. Description of the Related Art

Various metal films are used as a gate electrode in latest gate stack structures. As the shape of the device becomes finer and more complicated, a film formation process such as a chemical vapor deposition (CVD) method or an atomic layer deposition (ALD) method is increasingly employed in the formation of the metal films (for example, see Patent Document 1).

[Patent Document 1] International Publication No. 2007/132884

SUMMARY OF THE INVENTION

However, a metal film that is easily oxidized tends to be oxidized after formation thereof, thereby losing its innate characteristic. In addition, latest devices employ thinner films and decline oxygen in a metal electrode, and an underlying insulating film therein may have an increased thickness by a high temperature heat treatment process.

The object of the present invention is to provide a method of manufacturing a semiconductor device, a method of processing a substrate and a substrate processing apparatus capable of minimizing a degradation of characteristics caused by the oxidation of the metal film.

According to the present invention, a method of manufacturing a semiconductor device including:

(a) loading a substrate into a processing container;

(b) forming a metal film including a titanium aluminum nitride film on the substrate using a chemical deposition method by supplying a processing gas into the processing container and exhausting the processing gas;

(c) forming an aluminum nitride film on the metal film using the chemical deposition method by supplying an aluminum-containing source gas and a nitrogen-containing gas into the processing container and exhausting the aluminum-containing source gas and the nitrogen-containing gas; and (d) unloading the substrate from the processing container after forming the metal film and the aluminum nitride film;

(e) exposing the metal film by etching the aluminum nitride film under an oxygen-free atmosphere; and (f) forming an upper film including a metal on the metal film after performing the step (e), wherein the step (b) and the step (c) are continuously performed while maintaining an inside of the processing container to have an oxygen-free atmosphere, wherein the step (b) includes forming the titanium aluminum nitride film by one of a chemical vapor deposition method and an atomic layer deposition method using a titanium-containing source gas, the aluminum-containing source gas and the nitrogen-containing gas, wherein the step (c) includes forming the aluminum nitride film by the atomic layer deposition method using the aluminum-containing source gas and the nitrogen-containing gas, and wherein the step (e) and the step (f) are continuously performed under the oxygen-free atmosphere.

According to another embodiment of the present invention, there is provided a method of processing a substrate, including:

(a) loading a substrate into a processing container;

(b) forming a metal film including a titanium aluminum nitride film on the substrate using a chemical deposition method by supplying a processing gas into the processing container and exhausting the processing gas;

(c) forming an aluminum nitride film on the metal film using the chemical deposition method by supplying an aluminum-containing source gas and a nitrogen-containing gas into the processing container and exhausting the aluminum-containing source gas and the nitrogen-containing gas; and (d) unloading the substrate from the processing container after forming the metal film and the aluminum nitride film, wherein the step (b) and the step (c) are continuously performed while maintaining an inside of the processing container to have an oxygen-free atmosphere, wherein the step (b) includes forming the titanium aluminum nitride film by one of a chemical vapor deposition method and an atomic layer deposition method using a titanium-containing source gas, the aluminum-containing source gas and the nitrogen-containing gas, and wherein the step (c) includes forming the aluminum nitride film by the atomic layer deposition method using the aluminum-containing source gas and the nitrogen-containing gas.

According to still another embodiment of the present invention, there is provided a substrate processing apparatus including:

a processing container for processing a substrate;

a processing gas supply system for supplying a processing gas into the processing container;

an aluminum source gas supply system for supplying an aluminum-containing source gas into the processing container;

a nitrogen-containing gas supply system for supplying a nitrogen-containing gas into the processing container;

an exhaust system for exhausting an inside of the processing container; and a control unit for controlling the processing gas supply system, the aluminum source gas supply system, the nitrogen-containing gas supply system and the exhaust system so as to continuously perform: forming a metal film on the substrate using a chemical deposition method by supplying the processing gas into the processing container and exhausting the processing gas; and forming an aluminum nitride film on the metal film using the chemical deposition method by supplying the aluminum-containing source gas and the nitrogen-containing gas into the processing container and exhausting the aluminum-containing source gas and the nitrogen-containing gas while maintaining the inside of the processing container under an oxygen-free atmosphere.

BRIEF DESCRIPTION OF THE DRAWINGS

FIG. 6 is a configuration diagram schematically illustrating a vertical processing furnace of a vertical apparatus used for an embodiment of the present invention wherein FIG. 6b illustrates a cross-sectional view of the processing furnace taken along line A-A of FIG. 6a.

FIG. 7 is a diagram illustrating an evaluation result of first example wherein

FIG. 8 is a diagram illustrating TEM images of a cross-section of a gate stack manufactured in a gate-first process in accordance with a second example, wherein

FIG. 9 is a diagram illustrating a dependency of an equivalent-oxide thickness (EOT) and an effective work function in a gate stack manufactured in a gate-first process on a thickness of an AlN film in accordance with a third example wherein

DETAILED DESCRIPTION OF THE PREFERRED EMBODIMENTS (1) Configuration of Substrate Processing Apparatus First, a configuration of a substrate processing apparatus according to an embodiment of the present invention will be described in detail with reference to FIGS. 3 and 4.

(Processing Chamber)

Figure 3:
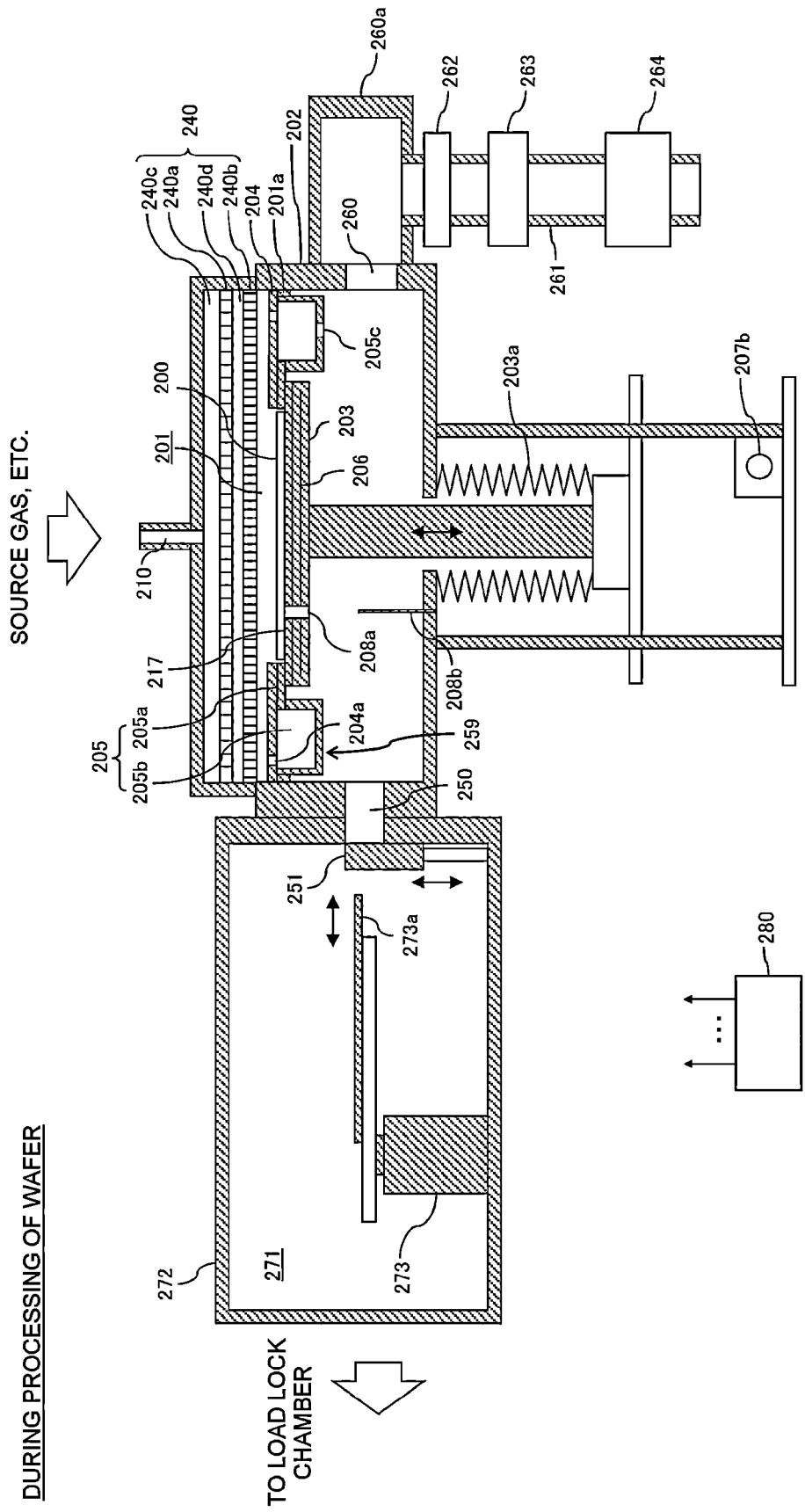
FIG. 3 is a cross-sectional view of a substrate processing apparatus during processing of a wafer according to an embodiment of the present invention.
Figure 4:
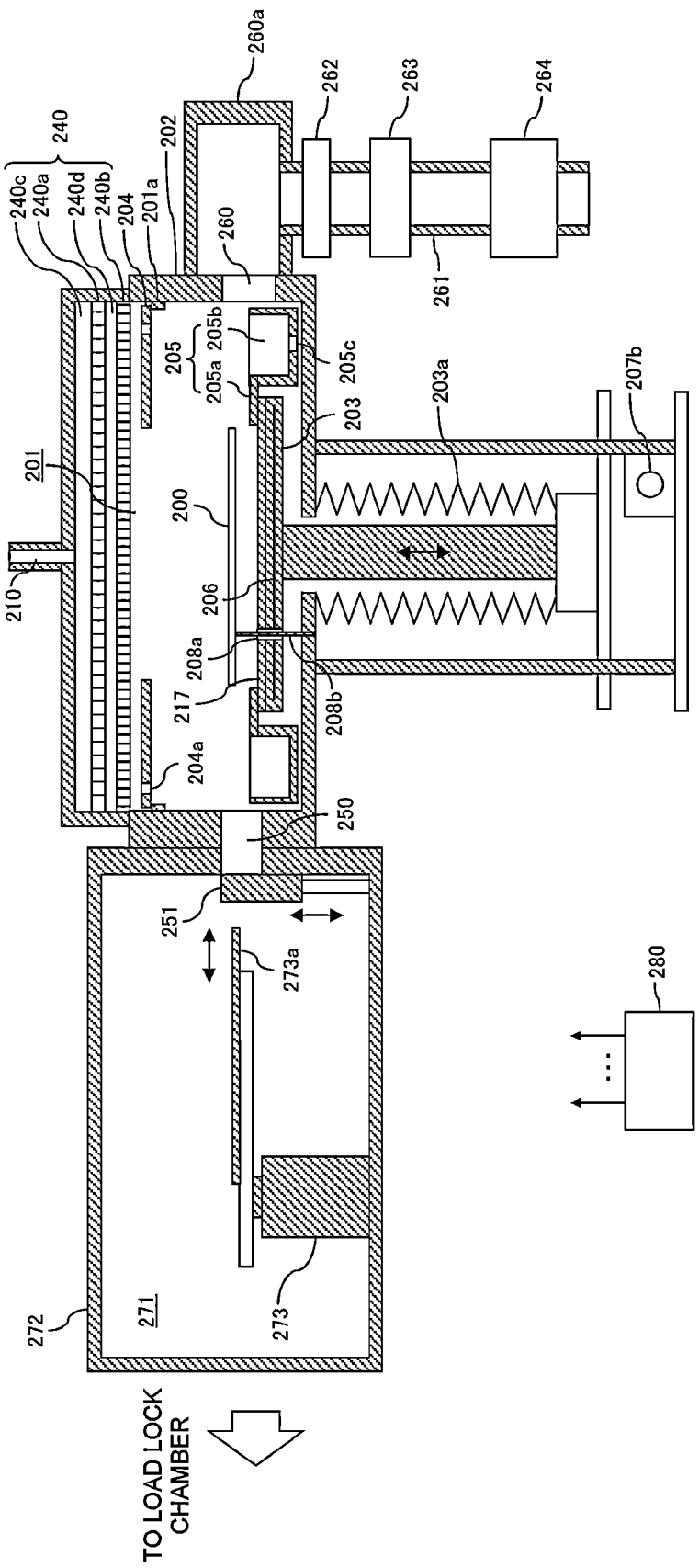
FIG. 4 is a cross-sectional view of a substrate processing apparatus during transfer of a wafer according to an embodiment of the present invention.

As shown in FIGS. 3 and 4, the substrate processing apparatus according to the embodiment of the present invention includes a processing container 202. The processing container 202 is configured to be, for example, an airtight container having a flat circular horizontal cross-section. In addition, the processing container 202 is, for example, made of a metal material such as an aluminum (Al) or a stainless steel (SUS). A processing chamber 201, in which a wafer 200 such as a silicon wafer is processed as a substrate, is disposed in the processing container 202.

(Support)

A support 203 for supporting the wafer 200 is installed inside the processing chamber 201. A susceptor 217 is, for example, installed as a support plate in an upper surface of the support 203 which is in direct contact with the wafer 200. The susceptor 217 may be made of a quartz (SiO2), a carbon, a ceramic, a silicon carbide (SiC), an aluminum oxide (Al2O3) or an aluminum nitride (AlN). In addition, the support 203 includes a heater 206 mounted therein as a heating means (a heating source) for heating the wafer 200. A lower end of the support 203 penetrates through a bottom of the processing container 202.

(Lifting Mechanism)

A lifting mechanism 207b for lifting the support 203 is installed outside the processing chamber 201. The wafer 200 supported by the susceptor 217 may be lifted by operating the lifting mechanism 207b to lift the support 203. The support 203 is lowered to a position (a wafer transfer position) shown in FIG. 4 when the wafer 200 is to be transferred, and lifted to a position (a wafer processing position) shown in FIG. 3 when the wafer 200 is to be processed. A circumference of the lower end of the support 203 is covered by a bellows 203a, and an inside of the processing chamber 201 is maintained to be air-tight.

(Lift Pin)

On a lower surface (bottom surface) of the processing chamber 201, three lift pins 208b, for example, are installed to protrude vertically with respect to the lower surface of the processing chamber 201. In addition, in the support 203 (including the susceptor 217), through holes 208a through which the lift pins 208b pass are installed at positions corresponding to the lift pins 208b. As shown in FIG. 4, when the support 203 is lowered to the wafer transfer position, upper ends of the lift pins 208b protrude from an upper surface of the susceptor 217, and the wafer 200 is supported from below by the lift pins 208b. In addition, as shown in FIG. 3, when the support 203 is lifted to the wafer processing position, the lift pins 208b no longer protrude from the upper surface of the susceptor 217, and the wafer 200 is supported from below by the susceptor 217. Since the lift pins 208b are in direct contact with the wafer 200, it is preferable that the lift pins 208b are made of a material such as quartz or alumina.

(Wafer Transfer Port)

A wafer transfer port 250 for transferring the wafer 200 out of/into the processing chamber 201 is installed at one side of an inner wall of the processing chamber 201 (the processing container 202). A gate valve 251 is installed on the wafer transfer port 250. The gate valve 251 is opened to connect the inside of the processing chamber 201 and an inside of the transfer chamber (a spare chamber) 271. The transfer chamber 271 is disposed inside a transfer container (an airtight container) 272, and a transfer robot 273 for transferring the wafer 200 is installed inside the transfer chamber 271. A transfer arm 273a that supports the wafer 200 during the transfer of the wafer 200 is included in the transfer robot 273. When the gate valve 251 is opened while the support 203 is lowered to the wafer transfer position, the wafer 200 may be transferred from the processing chamber 201 into the transfer chamber 271, and vice versa, by means of the transfer robot 273. The wafer 200 transferred into the processing chamber 201 is temporarily disposed on the lift pins 208b as described above. A load lock chamber (not shown) is installed at an opposite side of the wafer transfer port 250 of the transfer chamber 271. The transfer robot 273 may be used to transfer the wafer 200 from the load lock chamber into the transfer chamber 271, and vice versa. The load lock chamber serves as a spare chamber for temporarily accommodating the wafer 200 after or prior to processing.

(Exhaust System)

An exhaust port 260 for exhausting an atmosphere in the processing chamber is installed at an inner wall side of the processing chamber 201 (the processing container 202) which is opposite to the wafer transfer port 250. An exhaust pipe 261 is coupled to the exhaust port 260 via an exhaust chamber 260a, and a pressure regulator 262 such as an automatic pressure controller (APC) for controlling a pressure in the processing chamber 201, a source recovery trap 263 and a vacuum pump 264 are sequentially coupled to the exhaust pipe 261 in series. Generally, the exhaust system (an exhaust line) includes the exhaust port 260, the exhaust chamber 260a, the exhaust pipe 261, the pressure regulator 262, the source recovery trap 263 and the vacuum pump 264.

(Gas Introduction Port)

A gas introduction port 210 for supplying various gases into the processing chamber 201 is installed on an upper surface (a ceiling wall) of a shower head 240 installed above the processing chamber 201, which is described later. A configuration of a gas supply system coupled to the gas introduction port 210 will be described later.

(Shower Head)

The shower head 240 is installed as a gas distribution mechanism between the gas introduction port 210 and the processing chamber 201. The shower head 240 includes a distribution plate 240a for distributing gases introduced through the gas introduction port 210, and a shower plate 240b for distributing the gases more uniformly that has passed through the distribution plate 240a to be supplied on the surface of the wafer 200 disposed on the support 203. A plurality of vent holes are installed in the distribution plate 240a and the shower plate 240b. The distribution plate 240a is disposed so as to face an upper surface of the shower head 240 and the shower plate 240b, and the shower plate 240b is disposed so as to face the wafer 200 disposed on the support 203. The upper surface of the shower head 240 is spaced apart from the distribution plate 240a and the distribution plate 240a is spaced apart from the shower plate 240b. The corresponding spaces serve as a first buffer space (distribution chamber 240c) for distributing gases supplied through the gas introduction port 210 and a second buffer space 240d for diffusing the gases that has passed through the distribution plate 240a, respectively.

(Exhaust Duct)

A stepped portion 201a is installed at the inner wall side of the processing chamber 201 (the processing container 202). The stepped portion 201a is configured to support the conductance plate 204 about the wafer processing position. The conductance plate 204 includes a sheet of doughnut-shaped (ring-shaped) circular plate having holes at an inner circumference thereof so as to accommodate the wafer 200. A plurality of discharge ports 204a having a predetermined distance therebetween are installed at an outer circumference of the conductance plate 204 along a circumferential direction. The discharge ports 204a are discontinuously disposed so that the outer circumference of the conductance plate 204 may support the inner circumference of the conductance plate 204.

On the other hand, a lower plate 205 is anchored in the outer circumference of the support 203. The lower plate 205 includes a ring-shaped concaved portion 205b and a flange portion 205a integrally installed at an inner upper side of the concaved portion 205b. The concaved portion 205b is installed to cover a crevice (a gap) between the outer circumference of the support 203 and the inner side wall of the processing chamber 201. A plate exhaust port 205c for discharging (circulating) gases from the inner portion of the concaved portion 205b toward the exhaust port 260 is disposed at a portion of a bottom of the concaved portion 205b that is disposed near the exhaust port 260. The flange portion 205a serves as an anchoring member for anchoring the lower plates 205 on an upper circumferential edge of the support 203. Since the flange portion 205a is anchored on the upper circumferential edge of the support 203, the lower plate 205 is lifted and lowered together with the support 203 as the support 203 is lifted and lowered.

When the support 203 is lifted to the wafer processing position, the lower plate 205 is also lifted to the wafer processing position. As a result, the conductance plate 204 supported about the wafer processing position covers an upper surface of the concaved portion 205b of the lower plate 205, thereby forming an exhaust duct 259 in which the inner portions of the concaved portions 205b are connected to serve as a gas channel region. The inner portion of the processing chamber 201 is divided into two regions by the exhaust duct 259 (the conductance plate 204 and the lower plate 205) and the support 203: an upper processing chamber disposed above the exhaust duct 259 and a lower processing chamber disposed below the exhaust duct 259. It is preferable that the conductance plate 204 and the lower plate 205 are made of materials that are capable of supporting at high temperature, for example, a high temperature-resistant and load-resistant quartz in consideration of etching (self-cleaning) of the reaction products heaped on an inner wall of the exhaust duct 259.

Here, the gas flow in the processing chamber 201 in the processing of the wafer will be described in detail. First, a gas supplied from the gas introduction port 210 to an upper portion of the shower head 240 passes through the first buffer space (the distribution chamber 240c) through the plurality of holes of the distribution plate 240a to the second buffer space 240d, supplied to the processing chamber 201 through the plurality of holes of the shower plate 240b, and then uniformly supplied onto the wafer 200. Thereafter, the gas supplied onto the wafer 200 flows radially towards an outer radial side of the wafer 200. In addition, a gas remaining after contacting the wafer 200 flows radially on the exhaust duct 259, i.e. the conductance plate 204, disposed in an outer circumference of the wafer 200 towards an outer radial side of the wafer 200, and discharged via the discharge port 204a installed at the conductance plate 204 into the gas channel region (the concaved portion 205b) disposed inside the exhaust duct 259. Thereafter, the gas flows in the exhaust duct 259, and is exhausted through the exhaust port 260 via the plate exhaust port 205c. Such configuration prevents the remaining gas from returning to a lower portion of the processing chamber, i.e., a rear surface of the support 203 or a bottom of the processing chamber 201.

<Gas Supply System>

Figure 2:
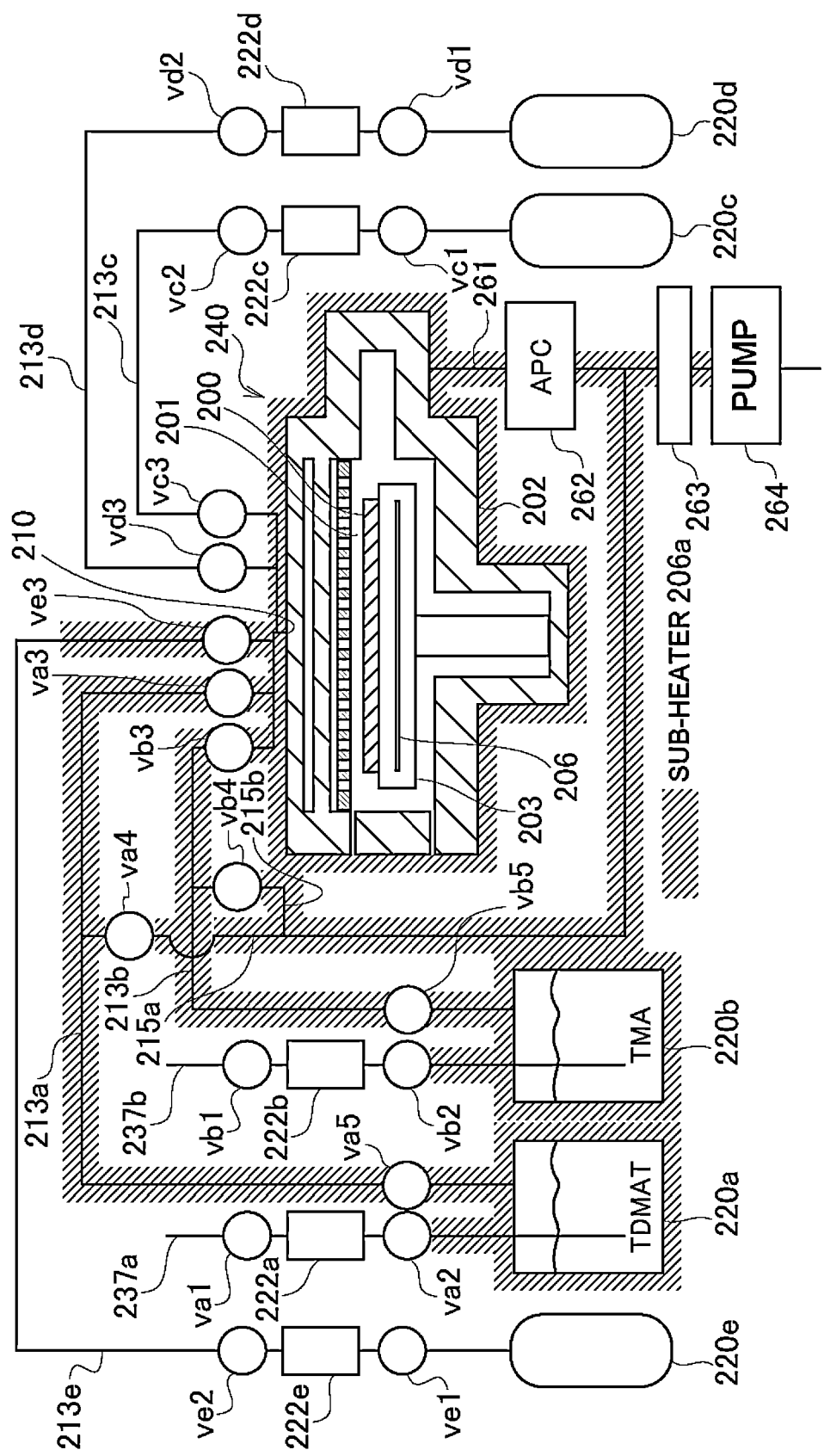
FIG. 2 is a configuration diagram of a gas supply system included in a substrate processing apparatus according to an embodiment of the present invention.

Next, the configuration of the gas supply system coupled to the above-described gas introduction port 210 will be described in detail with reference to FIG. 2. FIG. 2 is a configuration diagram of a gas supply system (a gas supply line) included in a substrate processing apparatus according to an embodiment of the present invention.

The gas supply system included in the substrate processing apparatus according to an embodiment of the present invention includes a bubbler used as a gasifying unit for gasifying a liquid source which is in a liquid state at a room temperature, a source gas supply system for supplying a source gas, which is obtained by gasifying the liquid source by the bubbler, into the processing chamber 201, and a reactive gas supply system for supplying a reactive gas different from the source gas into the processing chamber 201. In addition, the substrate processing apparatus according to an embodiment of the present invention includes a purge gas supply system for supplying a purge gas into the processing chamber 201, and a vent (bypass) system for exhausting the source gas from the bubbler to bypass the processing chamber 201 with no supply of the source gas into the processing chamber 201. Hereinafter, configurations of the respective components will be described in detail.

<Bubbler>

A first source container (a first bubbler 220a) for receiving a first source (source A) of the liquid source and a second source container (a second bubbler 220b) for supplying a second source (a source B) of the liquid source are installed outside the processing chamber 201. Each of the first bubbler 220a and the second bubbler 220b includes a tank (an airtight container) that is capable of accommodating (charging) the liquid source therein, and also includes a gasification unit for gasifying a liquid source by a bubbling process to generate the source gas. A sub-heater 206a for heating the first bubbler 220a, the second bubbler 220b and the liquid sources accommodated in the first bubbler 220a and the second bubbler 220b is installed about the first bubbler 220a and the second bubbler 220b. For example, an organic metal liquid source, tetrakis-dimethyl-amido-titanium (TDMAT, Ti [N(CH$_3$)$_2$]$_4$), including a titanium (Ti) element is used as the first source, and an organic metal liquid source, trimethylaluminum (TMA, Al(CH$_3$)$_3$), including an Al element is used as the second source.

A first carrier gas supply pipe 237a and a second carrier gas supply pipe 237b are coupled to the first bubbler 220a and the second bubbler 220b, respectively. A carrier gas supply source (not shown) is coupled to upstream side ends of the first carrier gas supply pipe 237a and the second carrier gas supply pipe 237b. In addition, downstream side ends of the first carrier gas supply pipe 237a and the second carrier gas supply pipe 237b are immersed in the liquid source accommodated in each of the first bubbler 220a and the second bubbler 220b. A mass flow controller (MFC) 222a for controlling a supply flow rate of a carrier gas and valves va1 and va2 for controlling the supply of the carrier gas are installed at the first carrier gas supply pipe 237a. An MFC 222b for controlling a supply flow rate of a carrier gas and valves vb1 and vb2 for controlling the supply of the carrier gas are installed at the second carrier gas supply pipe 237b. Gases that do not react with the liquid source may be used as the carrier gas, and an inert gas such as N$_2$ gas or Ar gas is, for example, suitable for the carrier gas. Generally, each of the first carrier gas supply system and the second carrier gas supply system (a first carrier gas supply line and a second carrier gas supply line) includes the first carrier gas supply pipe 237a, the second carrier gas supply pipe 237b, the MFCs 222a and 222b and the valves va1, va2, vb1 and vb2.

By such configuration, the first source and the second source accommodated in the first bubbler 220a and the second bubbler 220b may be gasified by the bubbling process to generate a first source gas and a second source gas, respectively, as the valves va1, va2, vb1 and vb2 are opened and the carrier gas having the flow rate controlled by the MFCs 222a and 222b is supplied from the first carrier gas supply pipe 237a and the second carrier gas supply pipe 237b into the first bubbler 220a and the second bubbler 220b. The supply flow rates of the first source gas and the second source gas may be calculated from the supply flow rate of the carrier gas. That is, the supply flow rates of the source gases may be controlled by controlling the supply flow rate of the carrier gas.

<Source Gas Supply System>

A first source gas supply pipe 213a and a second source gas supply pipe 213b, which supply the first source gas and the second source gas generated in the first bubbler 220a and the second bubbler 220b into the processing chamber 201, are coupled to the first bubbler 220a and the second bubbler 220b, respectively. Upstream side ends of the first source gas supply pipe 213a and the second source gas supply pipe 213b connected to spaces present above the first bubbler 220a and the second bubbler 220b, respectively. Downstream side ends of the first source gas supply pipe 213a and the second source gas supply pipe 213b are combined to be coupled to the gas introduction port 210.

Valves va5 and va3 are sequentially installed at the first source gas supply pipe 213a from an upstream side thereof. The valve va5 controls a supply of the first source gas from the bubbler 220a to the first source gas supply pipe 213a, and is installed adjacent to the bubbler 220a. The valve va3 controls a supply of the first source gas from the first source gas supply pipe 213a into the processing chamber 201, and is installed adjacent to the gas introduction port 210. In addition, valves vb5 and vb3 are sequentially installed at the second source gas supply pipe 213b from an upstream side thereof. The valve vb5 controls a supply of the second source gas from the bubbler 220b to the second source gas supply pipe 213b, and is installed adjacent to the bubbler 220b. The valve vb3 controls a supply of the second source gas from the second source gas supply pipe 213b into the processing chamber 201, and is installed adjacent to the gas introduction port 210. Each of the valve va3, the valve vb3 and a valve ve3 described later includes a high-durability, high-speed gas valve V. The high-durability, high-speed gas valve V is an integrated valve assembly that is capable of rapidly turning on and off a supply and an exhaust of a gas. The valve ve3 controls an introduction of a purge gas for purging the processing chamber 201 after purging a space between the valve va3 of the first source gas supply pipe 213a and the gas introduction port 210, and a space between the valve vb3 of the second source gas supply pipe 213b and the gas introduction port 210 at a high speed.

By such configuration, the first source and the second source are gasified in the first bubbler 220a and the second bubbler 220b to generate the first source gas and the second source gas, respectively. At the same time, the valves va5, va3, vb5 and vb3 may be opened to supply the first source gas and the second source gas from the first source gas supply pipe 213a and the second source gas supply pipe 213b into the processing chamber 201, respectively. Generally, each of the first source gas supply system and the second source gas supply system (a first source gas supply line and a second source gas supply line) includes the first source gas supply pipe 213a, the second source gas supply pipe 213b and the valves va5, va3, vb5 and vb3. According to the embodiment of the present invention, a titanium source gas supply system for supplying a source gas including titanium atoms includes the first source gas supply system, and an aluminum source gas supply system for supplying a source gas including aluminum atoms includes the second source gas supply system.

In addition, each of the first source supply system and the second source supply system (a first source supply line and a second source supply line) includes the first carrier gas supply system, the second carrier gas supply system, the first bubbler 220a, the second bubbler 220b, the first source gas supply system and the second source gas supply system. According to the embodiment of the present invention, the titanium source supply system includes the first source supply system, and the aluminum source supply system includes the second source supply system.

<Reactive Gas Supply System>

In addition, a reactive gas supply source 220c for supplying a reactive gas is installed outside the processing chamber 201. An upstream side end of the reactive gas supply pipe 213c is coupled to the reactive gas supply source 220c. A downstream side end of the reactive gas supply pipe 213c is coupled to the gas introduction port 210 via a valve vc3. An MFC 222c for controlling a supply flow rate of a reactive gas and valves vc1 and vc2 for controlling the supply of the reactive gas are installed at the reactive gas supply pipe 213c. A gas including nitrogen atoms, such as an ammonia ($NH_3$) gas, is used as the reactive gas. Generally, the reactive gas supply system (a reactive gas supply line) includes the reactive gas supply source 220c, the reactive gas supply pipe 213c, the MFC 222c and the valves vc1, vc2 and vc3. According to the embodiment of the present invention, a nitrogen-containing gas supply system for supplying a gas including nitrogen atoms includes the reactive gas supply system.

<Purge Gas Supply System>

In addition, purge gas supply sources 220d and 220e for supplying a purge gas are installed outside the processing chamber 201. Upstream side ends of the purge gas supply pipes 213d and 213e are coupled to the purge gas supply sources 220d and 220e, respectively. A downstream side end of the purge gas supply pipe 213d is coupled between the valve vc3 of the reactive gas supply pipe 213c and the gas introduction port 210 via a valve vd3. A downstream side end of the purge gas supply pipe 213e is coupled between the gas introduction port 210 and the valves va3 and vb3 of the first source gas supply pipe 213a and the second source gas supply pipe 213b via a valve ve3. MFCs 222d and 222e for controlling a supply flow rate of a purge gas and valves vd1, vd2, ve1 and ve2 for controlling the supply of the purge gas are installed at each of the purge gas supply pipes 213d and 213e. For example, the inert gas such as $N_2$ gas or Ar gas is used as the purge gas. The purge gas supply system (a purge gas supply line) generally includes the purge gas supply sources 220d and 220e, the purge gas supply pipes 213d and 213e, the MFCs 222d and 222e and the valves vd1, vd2, vd3, ve1, ve2 and ve3.

<Vent (Bypass) System>

In addition, upstream side ends of a first vent pipe 215a and a second vent pipe 215b are coupled to upper-stream sides of the valves va3 and vb3 of the first source gas supply pipe 213a and the second source gas supply pipe 213b, respectively. In addition, downstream side ends of the first vent pipe 215a and the second vent pipe 215b are combined, and coupled to a downer-stream side than the pressure regulator 262 of the exhaust pipe 261 and an upper-stream side than the source recovery trap 263. Valves va4 and vb4 for controlling the flow of gas are installed at the first vent pipe 215a and the second vent pipe 215b, respectively.

By such configuration, the gases flowing in the first source gas supply pipe 213a and the second source gas supply pipe 213b can bypass the processing chamber 201 to be exhausted through the exhaust pipe 261 out of the processing chamber 201 without flowing the gases into the processing chamber 201 as the valves va3 and vb3 are closed and the valves va4 and vb4 are opened. Generally, each of a first vent system and a second vent system (a first vent line and a second vent line) includes the first vent pipe 215a, the second vent pipe 215b and the valves va4 and vb4.

While the sub-heater 206a is installed about the first bubbler 220a and the second bubbler 220b as described above, the sub-heater 206a is also installed about the first carrier gas supply pipe 237a, the second carrier gas supply pipe 237b, the first source gas supply pipe 213a, the second source gas supply pipe 213b, the first vent pipe 215a, the second vent pipe 215b, the exhaust pipe 261, the processing container 202, the shower head 240 and so on. The sub-heater 206a is configured to prevent a re-liquefaction of the source gas in these members by heating the members, for example, at a temperature of 100° C. or less.

<Control Unit (Controller)>

The substrate processing apparatus according to the embodiment of the present invention includes a controller 280 for controlling operations of the respective components of the substrate processing apparatus. The controller 280 controls the operations of the gate valve 251, the lifting mechanism 207b, the transfer robot 273, the heater 206, the sub-heater 206a, the APC 262, the vacuum pump 264, the valves va1 to va5, vb1 to vb5, vc1 to vc3, vd1 to vd3 and ve1 to ve3, the mass flow controllers 222a, 222b, 222c, 222d and 222e, etc.

(2) Substrate Processing Process

Figure 1:
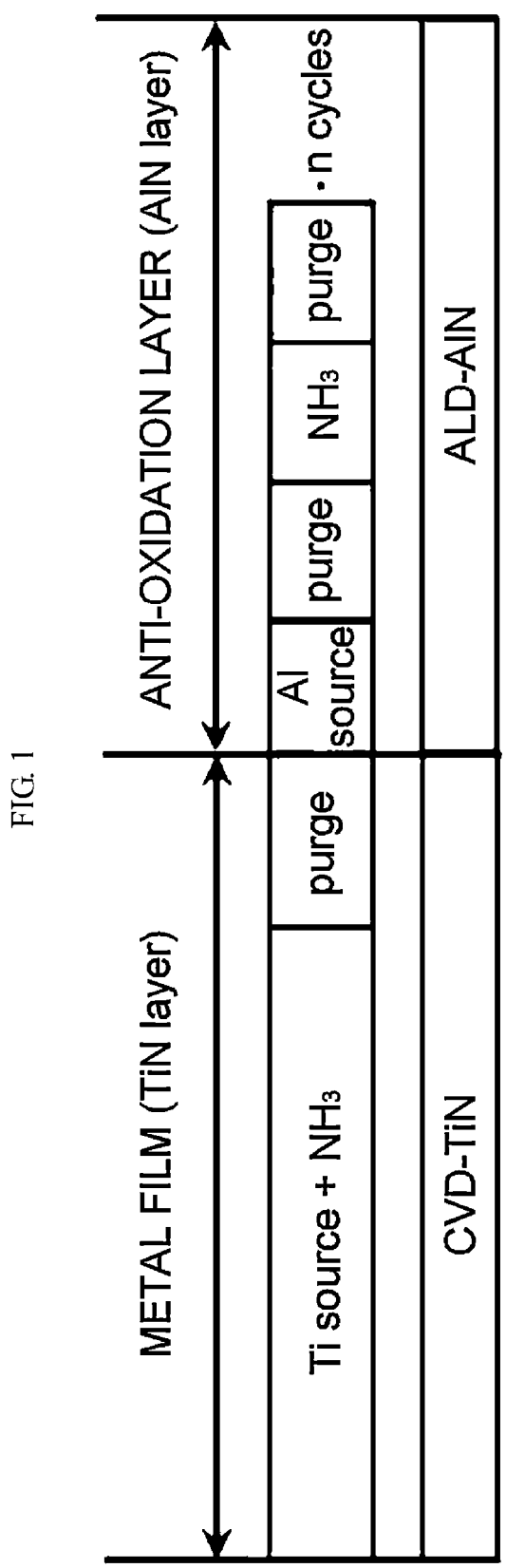
FIG. 1 is a flow diagram illustrating a film formation sequence in a substrate processing process according to an embodiment of the present invention.
Figure 5:
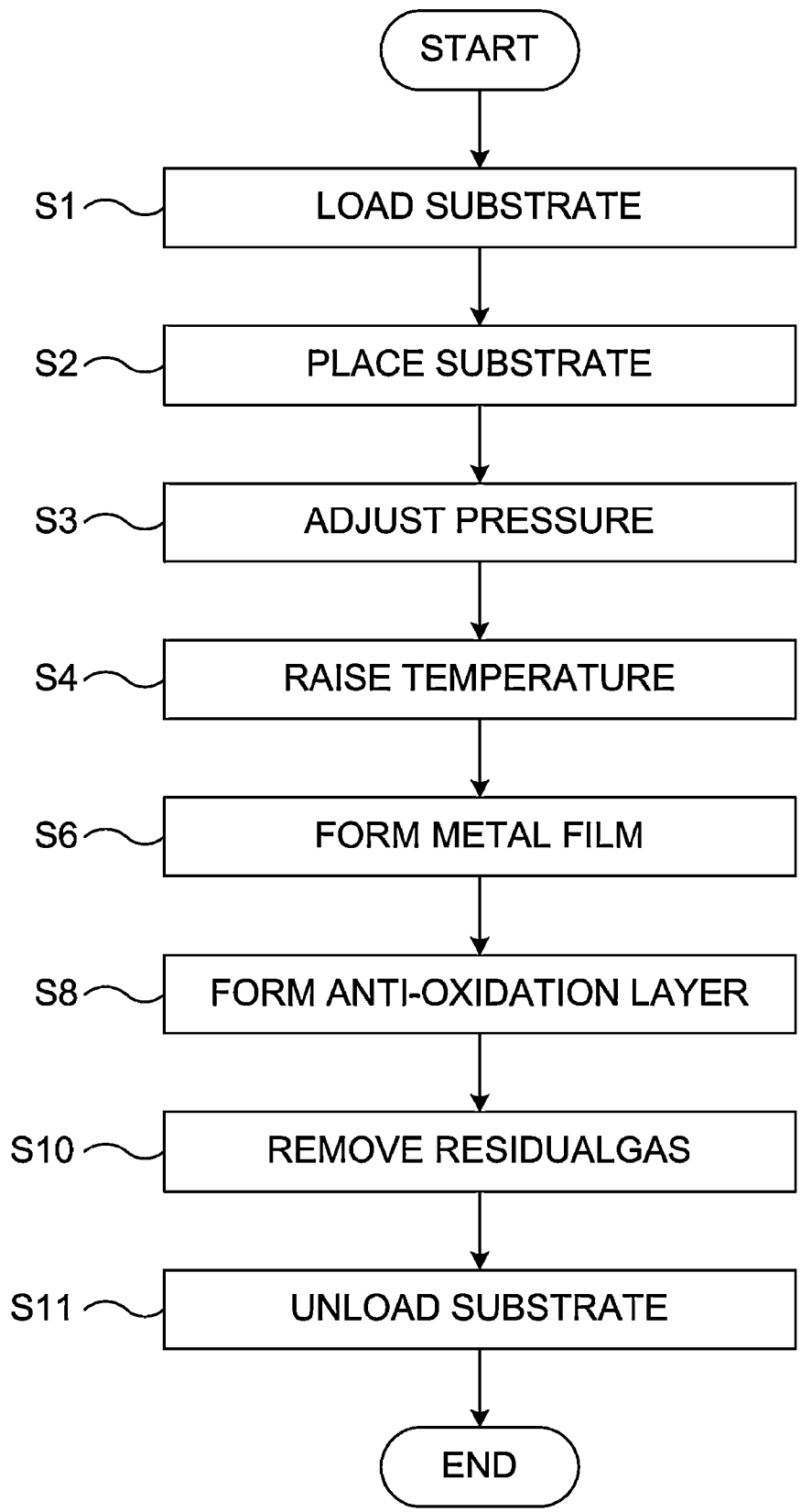
FIG. 5 is a flow diagram illustrating a substrate processing process according to an embodiment of the present invention.

Subsequently, a substrate processing process for forming a thin film on a wafer, which is one of manufacturing processes of a semiconductor device, using the above-described substrate processing apparatus will be described in detail with reference to FIGS. 1 and 5. FIG. 5 is a flow diagram illustrating the substrate processing process according to an embodiment of the present invention. In addition, FIG. 1 is a flow diagram illustrating a film formation sequence of forming processes of a metal film and an anti-oxidation layer in a substrate processing process according to an embodiment of the present invention. The operations of the components constituting the substrate processing apparatus are controlled by the controller 280 hereinafter.

An example will be described wherein the forming processes of the metal film and the anti-oxidation layer are continuously performed within the same processing chamber while an inside of the processing chamber is maintained under an oxygen-free atmosphere. In accordance with the example, the formation process of the metal film is performed by supplying a Ti source gas (TDMAT gas) and a nitrogen-containing gas ($NH_3$ gas) as a processing gas to a wafer on which a HfSiON film is formed as a high-dielectric constant (high-k) gate insulating film and having a SiON film as an interfacing layer interposed between the wafer and the HfSiON film, and forming a metal film (a TiN film) as a metal gate electrode on the wafer (the HfSiO film) using a chemical vapor deposition (CVD) method which is a type of the chemical deposition method. The formation process of the anti-oxidation layer is performed by alternatively supplying an Al source gas (TMA gas) and a nitrogen-containing gas ($NH_3$ gas) to the wafer and forming an anti-oxidation layer (an AlN film) on the metal film (the TiN film) using an ALD method which is a type of the chemical deposition method. Hereinafter, the term "metal film" refers to a film made of a conductive material including metal atoms. In addition to a conductive monolithic metal film made of a monolithic metal, the metal film includes a conductive metal nitride film, a conductive metal oxide film, a conductive metal oxynitride film, a conductive metal composite film, a conductive metal alloy film, a conductive metal silicide film, a conductive metal carbide film, etc. On the other hand, the TiN film is a conductive metal nitride film. Hereinafter, the example will be described in detail.

<Substrate Loading Process (S1) and Substrate Placement Process (S2)>

First, the lifting mechanism 207b is operated, and the support 203 is lowered to the wafer transfer position shown in FIG. 4. Thereafter, the gate valve 251 is opened to connect the processing chamber 201 to the transfer chamber 271. The wafer 200 to be processed is loaded from the transfer chamber 271 into the processing chamber 201 using the transfer robot 273, while the wafer 200 is supported by the transfer arm 273a (S1). The wafer 200 loaded into the processing chamber 201 is temporarily placed on the lift pin 208b which protrudes from an upper surface of the support 203. The gate valve 251 is closed when the transfer arm 273a of the transfer robot 273 returns to the transfer chamber 271 from the processing chamber 201.

Subsequently, the lifting mechanism 207b is operated to lift the support 203 to the wafer processing position shown in FIG. 3. As a result, the lift pin 208b no longer protrudes from the upper surface of the support 203, and the wafer 200 is placed on the susceptor 217 disposed on the support 203 (S2).

<Pressure-Regulating Process (S3) and Temperature-Increasing Process (S4)>

Thereafter, the automatic pressure regulator (APC) 262 controls an inner pressure of the processing chamber 201 such that the inner pressure reaches predetermined processing pressure (S3). A power supplied to the heater 206 is also adjusted, and a surface temperature of the wafer 200 is controlled such that the surface temperature reaches a predetermined processing temperature (S4). Here, the predetermined processing temperature and the predetermined processing pressure refer to a processing temperature and a processing pressure at which the TiN film may be formed using the CVD method in the formation process of the metal film which is to be described later. The predetermined processing temperature and the predetermined processing pressure also refer to a processing temperature and a processing pressure at which the AlN film may be formed using the ALD method in the formation process of the anti-oxidation layer which is to be described later. That is, the predetermined processing temperature and the predetermined processing pressure refer to a processing temperature and a processing pressure at which the first source gas used in the formation process of the metal film is self-decomposed, and at which the second source gas used in the formation process of the anti-oxidation layer is not self-decomposed.

In the substrate loading process (S1), the Substrate Placement Process (S2), the pressure-regulating process (S3) and the temperature-increasing process (S4), as a vacuum pump 264 starts to operate, the valves va3, vb3 and vc3 are closed and the valves vd1, vd2, vd3, ve1, ve2 and ve3 are opened to allow $N_2$ gas to continue to flow in the processing chamber 201. Therefore, it is possible to inhibit the attachment of particles onto the wafer 200.

In addition to processes S1 through S4, the first source is gasified to generate (pre-gasify) a first source gas. That is, the first source in the first bubbler 220a is gasified by the bubbling process to generate the first source gas as the valves va1, va2 and va5 are opened to supply the carrier gas whose flow rate is controlled, the carrier gas being supplied from the first carrier gas supply pipe 237a to the MFC 222a, into the first bubbler 220a, the first source accommodated in the first bubbler 220a is gasified by a bubbling process to generate a first source gas (a pre-gasifying process). In this pre-gasifying process, the processing chamber 201 is bypassed and exhausted without supplying the first source gas into the processing chamber 201 by closing the valve va3 and opening the valve va4 while the vacuum pump 264 is in operation. A predetermined period of time is required to stabilize the first source gas at the first bubbler. Accordingly, in accordance with the embodiment, the first source gas is generated in advance, and a first source gas channel is switched on and off as the valves va3 and va4 open and close. As a result, the stable supply of the first source gas into the processing chamber 201 may be rapidly started or stopped by the switching of the valves.

<Formation Process of the Metal Film (S6)>

(Supply Process of the First Source Gas and the Reactive Gas)

Subsequently, the supply of the first source gas (Ti source gas) into the processing chamber 201 is started by closing the valve va4 and opening the valve va3 while the vacuum pump 264 is in operation. Simultaneously, the valves vc1, vc2 and vc3 are opened to start the supply of the reactive gas ($NH_3$ gas) into the processing chamber 201. The first source gas and the reactive gas are distributed by the shower head 240, and uniformly supplied onto the wafer 200 disposed in the processing chamber 201. The remaining first source gas and the remaining reactive gas flow in the exhaust duct 259, and are exhausted through the exhaust port 260 and the exhaust pipe 261. Since the processing temperature and the processing pressure are set to be a temperature and a pressure at which the first source gas is self-decomposed, the first source gas supplied onto the wafer 200 is thermally decomposed, and also reacts with the reactive gas to cause a CVD reaction. Accordingly, the TiN film is formed as the metal film on the wafer 200. To be precise, TiN molecules are deposited on a HfSiON film formed on a SiON film interposed between the surface of the wafer 200 and the HfSiON film to form a TiN film.

As the first source gas and the reactive gas are supplied into the processing chamber 201, the valves vd1, vd2, vd3, ve1, ve2 and ve3 may be maintained to be open such that the $N_2$ gas continuously flows into the processing chamber 201 so as to facilitate a diffusion of the first source gas and the reactive gas in the processing chamber 201.

When a TiN film having a desired thickness is formed in a predetermined time period of time after the valves va3, vc1, vc2 and vc3 are opened to start the supply of the first source gas and the reactive gas, the valves va3, vc1, vc2 and vc3 are closed and the valve va4 is opened to stop the supply of the first source gas and the reactive gas into the processing chamber 201. Simultaneously, the valves va1 and va2 are also closed to stop the supply of the carrier gas to the first bubbler 220a.

(Purge Process)

After the valves va3, vc1, vc2 and vc3 are closed to stop the supply of the first source gas and the reactive gas, the valves vd1, vd2, vd3, ve1, ve2 and ve3 are opened to supply the $N_2$ gas into the processing chamber 201. The $N_2$ gas is distributed by the shower head 240, and supplied into the processing chamber 201. Thereafter, the $N_2$ gas flows through the exhaust duct 259 and exhausted through the exhaust port 260 and the exhaust pipe 261. Therefore, the first source gas, the reactive gas or reaction byproducts remaining in the processing chamber 201 are removed, and the processing chamber 201 is then purged with the $N_2$ gas (purge process).

In the formation process of the metal film (S6), the second source is gasified to generate (pre-gasify) a second source gas as a preparation to the subsequent forming process of the anti-oxidation layer (S8). That is, the second source accommodated in the second bubbler 220b may be gasified by the bubbling process to generate the second source gas, as the valves vb1, vb2 and vb5 are opened and the carrier gas having the flow rate controlled by the MFC 222b is supplied from the second carrier gas supply pipe 237b into the second bubbler 220b. In this pre-gasifying process, the processing chamber 201 is bypassed and exhausted without supplying the second source gas into the processing chamber 201 by closing the valve vb3 and opening the valve vb4 while the vacuum pump 264 is in operation. A predetermined period of time is required to stabilize the second source gas at the second bubbler. Accordingly, in accordance with the embodiment, the second source gas is generated in advance, and a second source gas channel is switched on and off as the valves vb3 and vb4 open and close. As a result, the stable supply of the second source gas into the processing chamber 201 may be rapidly started or stopped by the switching of the valves.

<Formation Process of the Anti-Oxidation Layer (S8)>

(Supply Process of the Second Source Gas)

In turn, as the vacuum pump 264 continues to operate, the valve vb4 is closed and the valve vb3 is opened to start the supply of the second source gas (an Al source) into the processing chamber 201. The second source gas is distributed by the shower head 240, and uniformly supplied onto the wafer 200 present in the processing chamber 201. An excess of the second source gas is allowed to flow through the exhaust duct 259 and exhausted through the exhaust port 260 and the exhaust pipe 261 (a second source gas-supplying process). Since the processing temperature and processing pressure are considered to be a processing temperature and a processing pressure at which the second source gas is not self-decomposed, the second source gas supplied onto the wafer 200 adsorbs to the surface of the wafer 200. To be precise speaking, gas molecules of the second source gas are adsorbed onto the TiN film formed on the wafer 200 in the above-described formation process of the metal film (S6).

As the second source gas is supplied into the processing chamber 201, the valves vd1, vd2, and vd3 may be maintained to be open such that the $N_2$ gas continuously flows into the processing chamber 201 so as to prevent the second source gas from flowing into the reactive gas supply pipe 213c and also facilitate a diffusion of the second source gas in the processing chamber 201.

After a predetermined period of time passes since the opening of the valve vb3 to start the supply of the second source gas, the valve vb3 is closed and the valve vb4 is opened to stop the supply of the second source gas into the processing chamber 201.

(Purge Process)

After the valve vb3 is closed to stop the supply of the second source gas, the valves vd1, vd2, vd3, ve1, ve2 and ve3 are opened to supply the $N_2$ gas into the processing chamber 201. The $N_2$ gas is distributed by the shower head 240, and supplied into the processing chamber 201. Thereafter, the $N_2$ gas flows through the exhaust duct 259 and exhausted through the exhaust port 260 and the exhaust pipe 261. Therefore, the second source gas remaining in the processing chamber 201 are removed, and the processing chamber 201 is then purged with the $N_2$ gas (purge process).

(Supply Process of the Reactive Gas)

When the processing chamber 201 is completely purged, the valves vc1, vc2 and vc3 are opened to start the supply of a reactive gas ($NH_3$ gas) into the processing chamber 201. The reactive gas is distributed by the shower head 240, and uniformly supplied onto the wafer 200 disposed in the processing chamber 201. The reactive gas then reacts with the second source gas adsorbed to the surface of the wafer 200 to form the AlN film on the wafer 200. To be precise, the reactive gas reacts with the molecules of the second source gas which are adsorbed onto the TiN film formed on the wafer 200 in the above-described formation process of the metal film (S6) to form the AlN film having a thickness of less than a single atomic layer (less than 1 Å) on the TiN film. The remaining reactive gas flows in the exhaust duct 259, and are exhausted through the exhaust port 260 and the exhaust pipe 261 (supply process of the reactive gas). As the reactive gas is supplied into the processing chamber 201, the valves ve1, ve2, and ve3 may be maintained to be open such that the $N_2$ gas continuously flows into the processing chamber 201 so as to prevent the reactive gas from flowing into the first source gas supply pipe 213a and the second source gas supply pipe 213b and also facilitate a diffusion of the reactive gas in the processing chamber 201. After a predetermined amount of time when the valves vc1, vc2 and vc3 are opened to start the supply of the reactive gas, the valves vc1, vc2 and vc3 are closed to stop the supply of the reactive gas into the processing chamber 201.

After a predetermined period of time passes since the opening of the valves vc1, vc2 and vc3 to start the supply of the reactive gas, the valves vc1, vc2 and vc3 are closed to stop the supply of the reactive gas into the processing chamber 201.

(Purge Process)

After the valves vc1, vc2 and vc3 are closed to stop the supply of the reactive gas, the valves vd1, vd2, vd3, ve1, ve2 and ve3 are opened to supply the N2 gas into the processing chamber 201. The N2 gas is distributed by the shower head 240, and supplied into the processing chamber 201. Thereafter, the N2 gas flows through the exhaust duct 259 and exhausted through the exhaust port 260 and the exhaust pipe 261. Therefore, the reactive gas or reaction byproducts remaining in the processing chamber 201 are removed, and the processing chamber 201 is then purged with the N2 gas (purge process).

(Cycling)

The above-described processes including the supply process of the second source gas, the purge process, the supply process of the reactive gas and the purge process are regarded as one cycle, and this ALD cycle is performed a predetermined number of times (n cycles) to form the AlN film as the anti-oxidation layer having a desired film thickness on the TiN film formed on the wafer 200 (a HfSiON film) in the above-described formation process of the metal film (S6). The AlN film as the anti-oxidation layer is formed to cover an entire surface of the TiN film. When the formation process of the anti-oxidation layer (S8) is completed, the valves vb1 and vb2 are closed to stop the supply of the carrier gas to the second bubbler 220b.

<Residual Gas Removing Process (S10)>

After the metal film and the anti-oxidation layer each having a predetermined film thickness are formed on the wafer 200, and a vacuum suction is performed in the processing chamber 201. Thereafter, the valves vd1, vd2, vd3, ve1, ve2 and ve3 are opened to supply the $N_2$ gas into the processing chamber 201. The $N_2$ gas is distributed by the shower head 240, and supplied into the processing chamber 201. Thereafter, the $N_2$ gas flows through the exhaust duct 259 and exhausted through the exhaust port 260 and the exhaust pipe 261. Therefore, the gases or reaction byproducts remaining in the processing chamber 201 are removed, and the processing chamber 201 is then purged with the $N_2$ gas.

<Substrate Unloading Process (S11)>

Thereafter, the substrate loading process (S1) and the substrate placement process (S2) are performed in a reverse order relative to the order described above to unload the wafer 200 having metal film and the anti-oxidation layer each having the desired film thickness thereon, from the processing chamber 201 to the transfer chamber 271, and the substrate processing process according to the embodiment of the present invention is completed.

According to the embodiment of the present invention, processing conditions of the wafer 200 in the formation process of the metal film (S6) are as follows:

Processing temperature: 250 to 450° C., preferably 350 to 450° C.,

Processing pressure: 30 to 266 Pa, preferably 30 to 100 Pa,

Supply flow rate of first source (TDMAT): 10 to 1000 sccm,

Supply flow rate of reactive gas ($NH_3$): 50 to 500 sccm,

Film thickness (TiN): 10 to 30 nm.

In addition, according to the embodiment of the present invention, processing conditions of the wafer 200 in the formation process of the anti-oxidation layer (S8) are as follows:

Processing temperature: 250 to 450° C., preferably 350 to 450° C.,

Processing pressure: 30 to 266 Pa, preferably 30 to 100 Pa,

Supply flow rate of second source (TMA): 10 to 1000 sccm,

Supply flow rate of reactive gas ($NH_3$): 50 to 500 sccm,

Film thickness (AlN): 1 to 5 nm, preferably 3 nm.

When the processing temperature is less than 250° C., a film formation reaction by the CVD method does not occur in the formation process of the metal film (S6). In addition, when the processing temperature exceeds 450° C., a film formation rate drastically increases in the formation process of the metal film (S6), which makes it difficult to control the thickness of the film. Therefore, the processing temperature is necessarily maintained in a range of 250° C. to 450° C. such that the film formation reaction by the CVD method is caused and the thickness of the film is also controlled in the formation process of the metal film (S6). When the processing temperature is 350° C. or higher, the impurity in the film is reduced and a resistivity thereof is lowered.

In addition, according to the embodiment of the present invention, the formation process of the metal film (S6) using the CVD method and the formation process of the anti-oxidation layer (S8) using the ALD method may be performed at the same processing temperature and/or the same processing pressure. That is, according to the embodiment of the present invention, the formation process of the metal film (S6) and the formation process of the anti-oxidation layer (S8) may be performed at a constant processing temperature and/or a constant processing pressure. When the processing temperature and the processing pressure are set to predetermined values within the scope described above, the film formation using the CVD method and the film formation using the ALD method may be embodied under the same conditions. In this case, when the film formation proceeds from the formation process of the metal film (S6) into the formation process of the anti-oxidation layer (S8), the change of processing temperature and the change in processing pressure are unnecessary, which leads to improved throughput.

(3) Effects According to the Embodiment

According to the embodiment of the present invention, since the AlN film (with AlN cap) is formed in situ as the anti-oxidation layer on the TiN film under a vacuum atmosphere without exposing the TiN film to an atmosphere after the TiN film is formed as the metal film, oxygen in the atmosphere is blocked by the AlN film and the oxidation of the TiN layer by the oxygen in the atmosphere is prevented. According to the embodiment, due to an oxygen barrier effect of the AlN cap, an effect of the oxidation of the TiN film is minimized and a degradation of the characteristics such as an increase in a resistance generated by the oxidation of a surface of the TiN film and an increase in EOT.

In addition, according to the embodiment of the present invention, the formation of the TiN film as the metal film using the CVD method and the formation of the AlN film as the anti-oxidation layer using the ALD method are not performed at the same time but performed separately. In addition, the purge process is performed after the supply process of the first source gas and the supply process of the reactive gas in the formation process of the metal film (S6) to substitute the inside of the processing chamber 201 with different gases. Also in the formation process of the anti-oxidation layer (S8), the inside of the processing chamber 201 is completely substituted with different gases by performing the purge process at the end of the cycling. Therefore, a formation of particles caused by a gas-phase reaction of the first source gas and the second source gas in the processing chamber 201 is prevented without mixing the first source gas and the second source gas in the processing chamber 201 to improve a uniformities of the thickness and a composition of the TiN film or the AlN film. On the other hand, when the formation of the TiN film using the CVD method and the formation of the AlN film using the ALD method are performed at the same time, it is necessary to consider a mixing time and a reaction of the first source gas and the second source gas, which renders it difficult to control the thickness and the composition of the TiN film or the AlN film. In addition, a combination of the gas species generates particles due to the gas-phase reaction of the first source gas and the second source gas, thereby degrading the uniformity of the thickness and the composition of the TiN film or the AlN film.

In addition, according to the embodiment of the present invention, since a relatively high-temperature process is used for the film formation of the TiN film using the CVD method, an ALD precursor having a relatively high decomposition temperature may be selected for the film formation of the AlN film. That is, since the CVD/ALD method is performed at a high temperature, it is possible to reduce residual impurities in the films using heat with no use of a damage source such as plasma.

<Another Embodiment of the Present Invention>

According to the above-described embodiment, the liquid source accommodated in the bubbler is gasified by the bubbling process. However, a vaporizer may be used instead of the bubbler to gasify the liquid source.

In addition, according to above-described embodiment, the TDMAT is used as the Ti source in the formation process of the metal film (S6). However, Ti source such as $TiCl_4$ may be used in place of the TDMAT. In addition, according to the above-described embodiment, the Ti source and the reactive gas such as $NH_3$ are supplied together to the wafer in the formation process of the metal film (S6). However, only the Ti source may be supplied to the wafer when TDMAT is used as the Ti source. Since the TDMAT includes both Ti atoms and N atoms, only the TDMAT may be supplied to form the TiN film.

In addition, according to above-described embodiment, the TiN film is formed by the CVD method in the formation process of the metal film (S6). However, the TiN film may be formed by the ALD method. In this case, the above-described processes including the supply process of the first source gas, the purge process, the supply process of the reactive gas and the purge process are regarded as one cycle, and this ALD cycle is performed a predetermined number of times (n cycles) to form the TiN film on the wafer 200. That is, the TiN film may be formed by one of the CVD method and the ALD method among chemical deposition methods.

The formation of the TiN film by a physical vapor deposition (PVD) method can be considered. However, a PVD-TiN film has a low possibility of being applied to the present invention since the PVD-TiN film has a high density and a low oxidizability. On the other hand, the TiN film formed by the chemical deposition method such as the CVD method or the ALD method can be easily oxidized, and a concentration of 10 to 30% of oxygen incorporates into the TiN film (the change in content takes place with time) when the TiN film is kept in the atmosphere after the film formation. In such case, when the TiN film is, for example, subjected to an activation annealing (spike) at 1000° C., the oxygen in the TiN film penetrates through a high-k film such as the HfSiON film and reaches the interfacing layer such as the SiON film, thereby increasing the thickness of the interfacing layer to increase the EOT. That is, the present invention may be particularly effective when the TiN film is formed by the chemical deposition method such as the CVD method or ALD method.

In addition, according to the above-described embodiment, a TMA is used as the Al source in the formation process of the anti-oxidation layer (S8). However, an Al source such as $AlCl_3$ may be used in place of the TMA.

In addition, according to the above-described embodiment, the TiN film is formed as the metal film. However, the present invention is not particularly limited thereto, and is applicable to the formation of a titanium aluminum nitride film (a TiAlN film) as the metal film. The TiAlN film is a conductive metal composite film.

In addition, according to the above-described embodiment, the SiON film is used as the interfacing layer. However, a $SiO_2$ film may be used as the interfacing layer in place of the SiON film. In addition, according to the above-described embodiment, the HfSiON film is used as the high-k gate insulating film. However, high-k insulating films such as a HfSiO film, a HfO film, a HfON film, a HfAlO film and a HfLaO film may be used as the high-k gate insulating film in place of the HfSiON film.

In addition, according to the above-described embodiment, the TiN film as the metal gate electrode is formed wherein the SiON film and the HfSiON film are interposed as the interfacing layer and the high-k gate insulating film on the wafer, respectively and the AlN film are formed as the anti-oxidation layer on the TiN film. A metal film such as a tungsten (W) film may be formed on the AlN film. When the present invention is applied to the gate stack as described above, the AlN film does not need to be removed. However, the AlN film may be etched back prior to the formation of the metal film such as the W film. In such case, the AlN film may be, for example, etched back with an Ar plasma, etc. For example, an apparatus for forming the metal film such as the W film may be used to etch back the AlN film with the Ar plasma in an oxygen-free atmosphere to expose the surface of the TiN film and form the metal film such as the W film in situ on the TiN film while the oxygen-free atmosphere is maintained without exposing the surface of the TiN film to air.

<Another Embodiment of the Present Invention>

According to the above-described embodiment, the films are formed using a single-type apparatus that processes one substrate per batch as the substrate processing apparatus. However, the present invention is not particularly limited to the above-described embodiment. For example, the films may be formed using a batch-type vertical apparatus that processes a plurality of substrates per batch as the substrate processing apparatus. Hereinafter, a method of forming a film using the vertical apparatus will be described in detail.

Figure 6A:
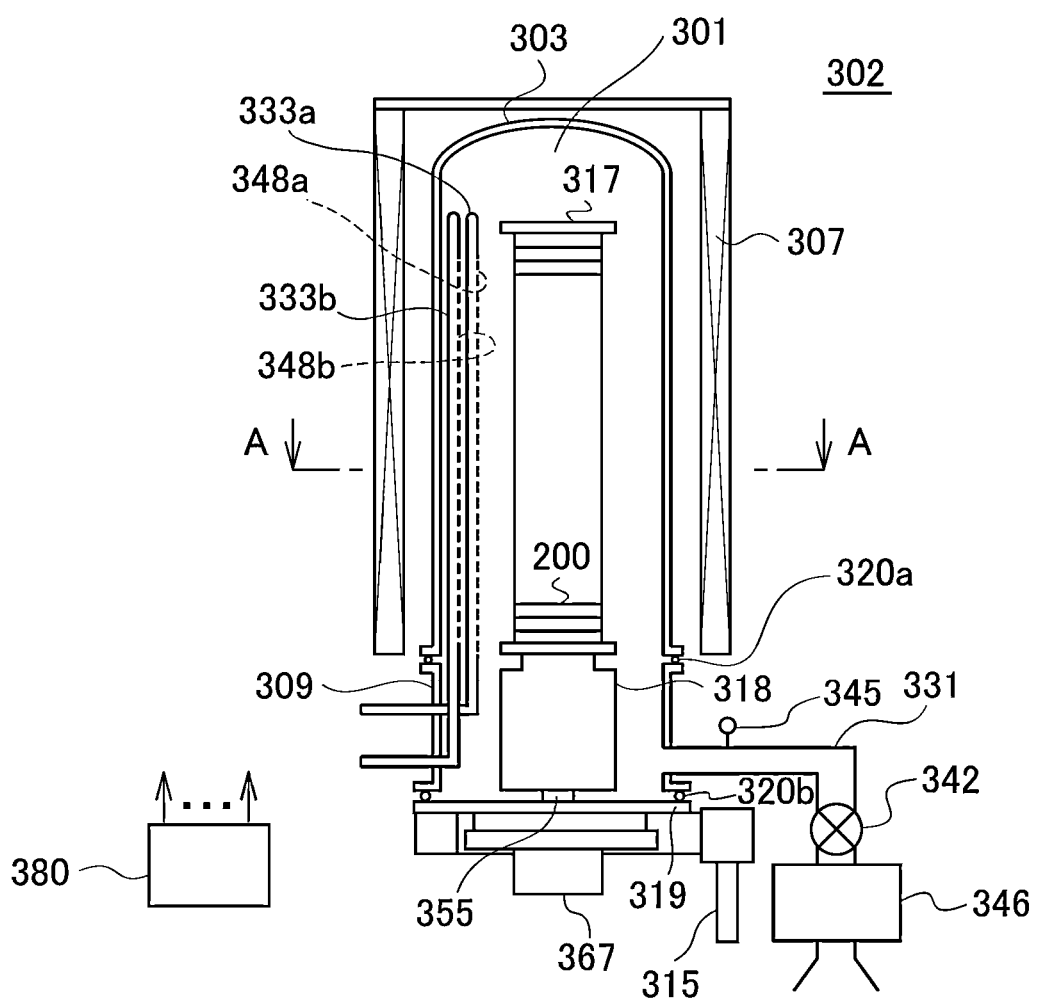
FIG. 6a illustrates a longitudinal cross-section of the processing furnace.
Figure 6B:
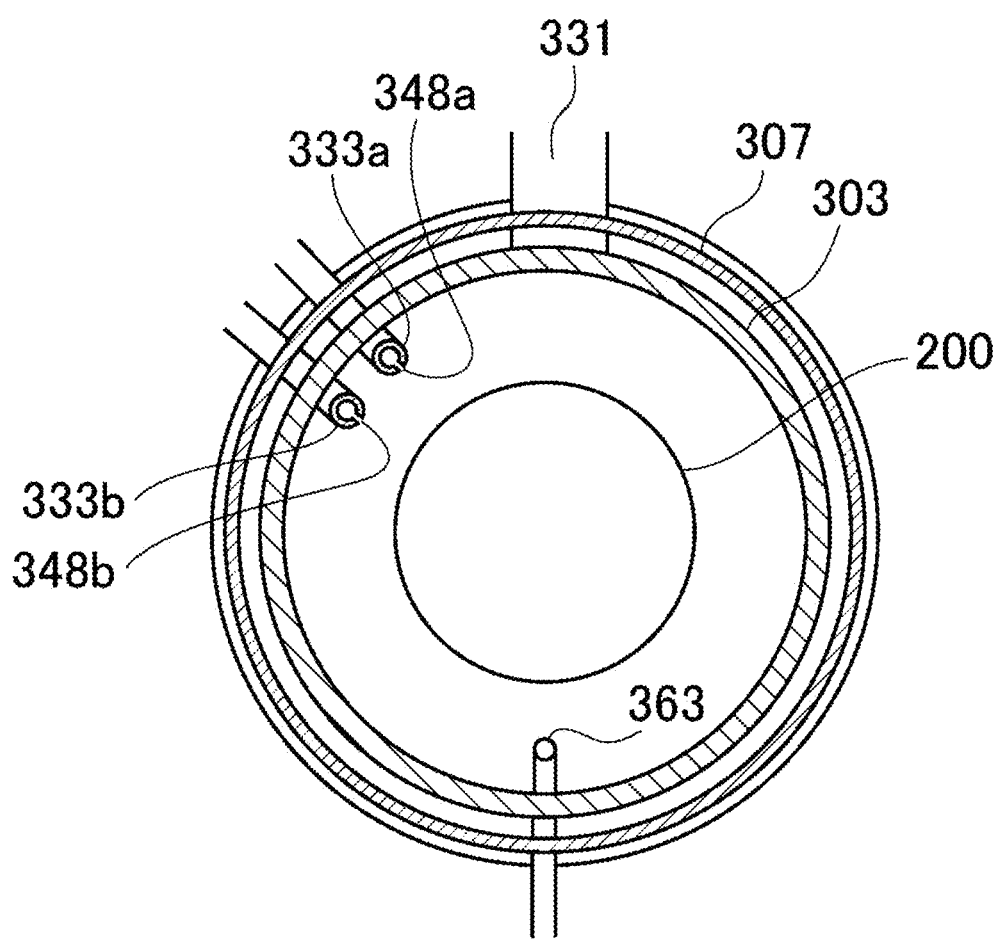

FIG. 6 is a configuration diagram schematically illustrating a vertical processing furnace of a vertical apparatus suitable for an embodiment of the present invention wherein FIG. 6a illustrates a longitudinal cross-section of the processing furnace, and FIG. 6b illustrates a cross-sectional view of the processing furnace taken along line A-A of FIG. 6a.

As shown in FIG. 6a, a processing furnace 302 includes a heater 307 as a heating unit (a heating mechanism). The heater 307 has a cylindrical shape, and is vertically installed and supported by a heater base as a support plate.

A process tube 303 is installed as a reaction pipe inside the heater 307 such that the process tube 303 is concentric to the heater 307. The process tube 303 is, for example, made of a heat-resistant material such as quartz ($SiO_2$) or silicon carbide (SiC), and has a cylindrical shape with a closed upper end and an open lower end. A processing chamber 301 is disposed in a hollow portion of the process tube 303, and configured to accommodate the wafer 200 as the substrate in a manner that the wafer 200 is vertically stacked by a boat 317 while maintaining a horizontality thereof, which is described later.

A manifold 309 is installed at a lower portion of the process tube 303 concentric to the process tube 303. The manifold 309 is, for example, made of stainless steel, etc., and has a cylindrical shape with open upper and lower ends. The manifold 309 is connected to the process tube 303 and installed to support the process tube 303. An O-ring 320a is installed as a sealing member between the manifold 309 and the process tube 303. As the manifold 309 is supported by the heater base, the process tube 303 is vertically fixed. A reaction container is disposed by the process tube 303 and the manifold 309.

A first nozzle 333a, which is a first gas introduction member, and a second nozzle 333b, which is a second gas introduction member, penetrate a sidewall of the manifold 309. Each of the first nozzle 333a and the second nozzle 333b has an L shape including a horizontal portion and a vertical portion. Here, the horizontal portion is connected to the manifold 309, and the vertical portion is installed between the inner wall of the process tube 303 and the wafer 200, so that the vertical portion is disposed vertically with respect to an arc-shaped space along the upper inner wall from the lower portion of the process tube 303 in a stacking direction of the wafer 200. A first gas supply hole 348a and a second gas supply hole 348b are installed at vertical side portions of the first nozzle 333a and the second nozzle 333b, respectively for supplying a gas. Each of the first gas supply hole 348a and the second gas supply hole 348b has a same opening area and a same opening pitch.

The gas supply system connected to the first nozzle 333a and the second nozzle 333b is same as the above-described embodiment. However, the gas supply system differs from the above-described embodiment in that the first source gas supply system and the second source gas supply system are connected to the first nozzle 333a and the reactive gas supply system is connected to the second nozzle 333b. That is, according to the embodiment of the present invention, the source gas (the first source gas and the second source gas) and the reactive gas are supplied through the first nozzle 333a and the second nozzle 333b, respectively. The source gases may be supplied through the respective nozzles.

An exhaust pipe 331 for exhausting an atmosphere in the processing chamber 301 is installed at the manifold 309. A vacuum pump 346 is connected to the exhaust pipe 331 as a vacuum exhaust apparatus via a pressure sensor 345 and an APC valve 342 functioning as a pressure detector and a pressure regulator, respectively. The vacuum pump 346 serves to control the APC valve 342 based on a pressure information detected by the pressure sensor 345, and is configured to exhaust the atmosphere so that the pressure in the processing chamber 301 may be adjusted to a predetermined pressure (a degree of vacuum). The APC valve 342 is an on/off valve configured to start/stop the exhaust by opening and closing a valve, and to adjust the pressure in the processing chamber 301 by further adjusting an opening level of the valve.

A seal cap 319, which is a furnace entrance cover that may close a lower opening of the manifold 309 air-tight, is installed at a lower portion of the manifold 309. The seal cap 319 is suitably in contact with a lower end of the manifold 309 from a vertical direction. The seal cap 319 is, for example, made of a metal such as stainless steel, and has a shape of a disk. An O-ring 320b, which is a seal member that is suitably in contact with the lower end of the manifold 309, is installed on an upper surface of the seal cap 319. A rotation mechanism 367 for rotating the boat 317, which is described later, is installed at an opposite position of the processing chamber 301 of the seal cap 319. Since a rotational shaft 355 of the rotation mechanism 367 is connected to the boat 317 through the seal cap 319, the wafer 200 is rotated by rotating the boat 317. The seal cap 319 is configured to be vertically lifted by a boat elevator 315 as a lifting mechanism disposed outside the process tube 303. Therefore, the boat 317 may be loaded and unloaded into/from the processing chamber 301.

The boat 317, which is a substrate supporting unit, is, for example, made of the heat-resistant material such as quartz or silicon carbide, and configured to support a plurality of wafers 200 vertically stacked with centers thereof aligned while maintaining the horizontality thereof. Since an adiabatic member 318 made of the heat-resistant material such as quartz or silicon carbide is installed below the boat 317 to prevent a heat from the heater 307 from being transferred toward the seal cap 319. A temperature sensor 363, which is a temperature detector, is installed in the process tube 303. An electrical power supplied to the heater 307 is controlled based on a temperature information detected by the temperature sensor 363 in a manner that a temperature inside the processing chamber 301 has a predetermined temperature distribution. The temperature sensor 363 is installed along the inner wall of the process tube 303 similar to the first nozzle 333a and the second nozzle 333b.

A controller 380, which is a control unit (control means), controls operations of the APC valve 342, the heater 307, the temperature sensor 363, the vacuum pump 346, the rotation mechanism 367, the boat elevator 315, the valves va1 through va5, vb1 through vb5, vc1 through vc3, vd1 through vd3 and ve1 through ve3, and the mass flow controllers 222a, 222b, 222c, 222d and 222e.

Next, a substrate processing process of forming a thin film on a wafer, which is one of the methods of manufacturing a semiconductor device, using a processing furnace of the vertical apparatus according to the above-described configuration will be described. An example will be described wherein the forming processes of the metal film and the anti-oxidation layer are continuously performed within the same processing chamber while the processing chamber is maintained under an oxygen-free atmosphere. In accordance with the example, the formation process of the metal film is performed by supplying the Ti source gas (TiCl$_4$ gas) and a nitrogen-containing gas (NH$_3$ gas) as a processing gas to the wafer on which a HfSiON film is formed as a high-dielectric constant (high-k) gate insulating film and having a SiON film as an interfacing layer interposed between the wafer and the HfSiON film, and forming the metal film (a TiN film) as the metal gate electrode on the wafer (the HfSiO film) using the CVD method which is a type of the chemical deposition method. The formation process of the anti-oxidation layer is performed by alternatively supplying the Al source gas (TMA gas) and a nitrogen-containing gas (NH$_3$ gas) to the wafer and forming an anti-oxidation layer (the AlN film) on the metal film (the TiN film) using the ALD method which is a type of the chemical deposition method. Hereinafter, operations of components constituting the vertical apparatus are controlled by the controller 380.

A plurality of wafers 200 are loaded (wafer charging) into the boat 317. Thereafter, the boat 317 that supports the plurality of wafers 200 is lifted by the boat elevator 315, and loaded (boat loading) into the processing chamber 301, as shown in FIG. 6a. In this case, the seal cap 319 seals the lower end of the manifold 309 by interposing the O-ring 320b.

The processing chamber 301 is vacuum-exhausted by the vacuum pump 346 so that the inside of the processing chamber 301 is at a desired pressure (a degree of vacuum). In this case, the inner pressure of the processing chamber 301 is measured using the pressure sensor 345, and the APC valve 342 is controlled via a feedback based on the measured pressure. In addition, the processing chamber 301 is heated by the heater 307 so that the inside of the processing chamber 301 is at a desired temperature. In this case, the electrical power supplied to the heater 307 is controlled via a feedback based on a temperature information detected by the temperature sensor 363 so that the processing chamber 301 has a predetermined temperature distribution. Subsequently, the wafer 200 is rotated by rotating the boat 317 using the rotation mechanism 367.

Thereafter, the formation process of the metal film is performed to form the TiN film on the wafer 200 (HfSiON film). Afterward, the formation process of the anti-oxidation layer is performed in situ in a vacuum atmosphere without exposing the TiN film to the air to form the AlN film on the TiN film. The order of the formation process of the metal film is identical to that of the formation process of the metal film (S6) according to the above-described embodiment. In addition, the order of the formation process of the anti-oxidation layer is identical to that of the formation process of the anti-oxidation layer (S8) according to the above-described embodiment.

After the metal film and the anti-oxidation layer each having a predetermined film thickness are formed on the wafer 200, a vacuum suction is performed in the processing chamber 301. Thereafter, N$_2$ gas is supplied into the processing chamber 301, and then exhausted. As a result, the gases or the reaction byproducts remaining in the processing chamber 301 are removed, and the processing chamber 301 is then purged with the N$_2$ gas.

Subsequently, the lower end of the manifold 309 is opened by lowering the seal cap 319 using the boat elevator 315. At the same time, the wafer 200 on which the metal film and the anti-oxidation layer each having the predetermined thickness are formed is unloaded (boat unloading) out of the process tube 303 through the lower end of the manifold 309 while the wafer 200 is supported by the boat 317. Thereafter, the substrate processing process according to the embodiment of the present invention is completed by extracting the finished wafer 200 from the boat 317.

Like the above-described embodiment, the TDMAT may be used as the Ti source in the formation process of the metal film according to the embodiment of the present invention. In addition, when the TDMAT is used, only the Ti source may be supplied. In the formation process of the metal film, the TiN film may also be formed using the ALD method. Similar to the above-described embodiment, AlCl$_3$ may also be used as the Al source in the formation process of the anti-oxidation layer according to the embodiment of the present invention. Similar to the above-described embodiment, a TiAlN film may also be used as the metal film in place of the TiN film according to the embodiment of the present invention. In addition, a $SiO_2$ film may be used as the interfacing layer in place of the SiON film. In addition, high-k insulating films such as the HfSiO film, the HfO film, the HfON film, the HfAlO film, the HfLaO film, etc. may be used as the high-k gate insulating film in place of the HfSiON film.

EXAMPLES

First Example

In accordance with a first example of the present invention, a dependency of resistivities of the TiN film and the TiAlN film on an air exposure time for cases where the AlN film is formed as the anti-oxidation layer on the TiN film and the TiAlN film and where the AlN film is not formed on the TiN film and the TiAlN film will be described in detail. The AlN film was formed in the same manner as in the above-described embodiment using the ALD method. The TiN film was formed in the same manner as in the above-described embodiment using the CVD method. The TiAlN film was formed by alternatively repeating the formation of the AlN film using the ALD method and the formation of the TiN film using the CVD method. Both of the films were formed using the substrate processing apparatus according to the above-described embodiment. In addition, the processing conditions used herein were set to be within the processing conditions described in the above-described embodiments.

Figure 7A:
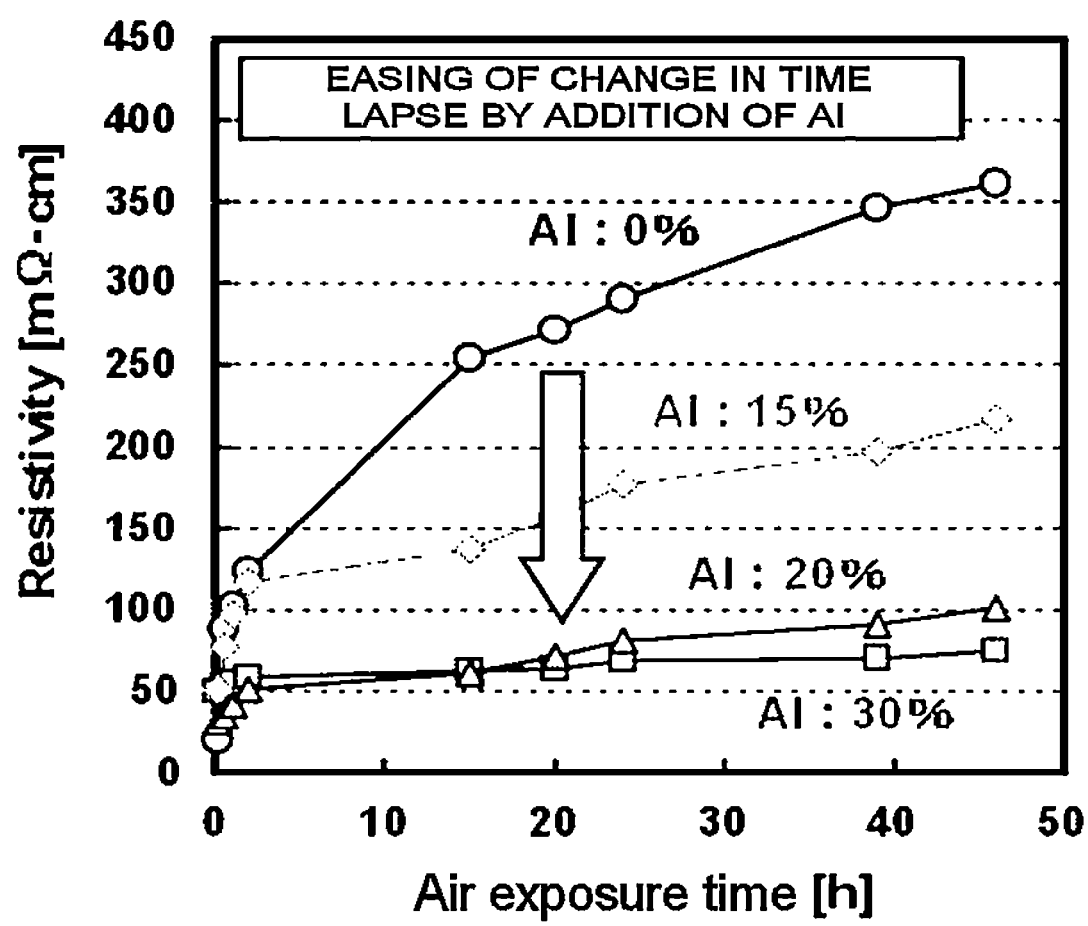
FIG. 7a illustrates dependencies of resistivities of a TiN film and a TiAlN film on air exposure time when an AlN film, which is an anti-oxidation layer, is not formed on the TiN film and the TiAlN film.

FIG. 7a illustrates the dependency of the resistivities of the TiN film and the TiAlN film on the air exposure time when the AlN film, which is the anti-oxidation layer, is not formed on the TiN film and the TiAlN film (hereinafter, referred to as "without AlN cap"). In FIG. 7a, the horizontal axis represents the air exposure time (time period during which the TiN film and the TiAlN film are exposed to atmosphere) of the TiN film and the TiAlN film when there is no AlN cap, and the vertical axis represents electric resistivities of the TiN film and the TiAlN film. Mark "○" in the drawing represents the electric resistivity of the TiN film having 0% Al content when there is no AlN cap. Mark "□" in the drawing represents the electric resistivity of the TiAlN film having 30% Al content when there is no AlN cap. Mark "Δ" in the drawing represents the electric resistivity of the TiAlN film having 20% Al content when there is no AlN cap. Mark "◇" in the drawing represents the electric resistivity of the TiAlN film having 15% Al content when there is no AlN cap.

Figure 7B:
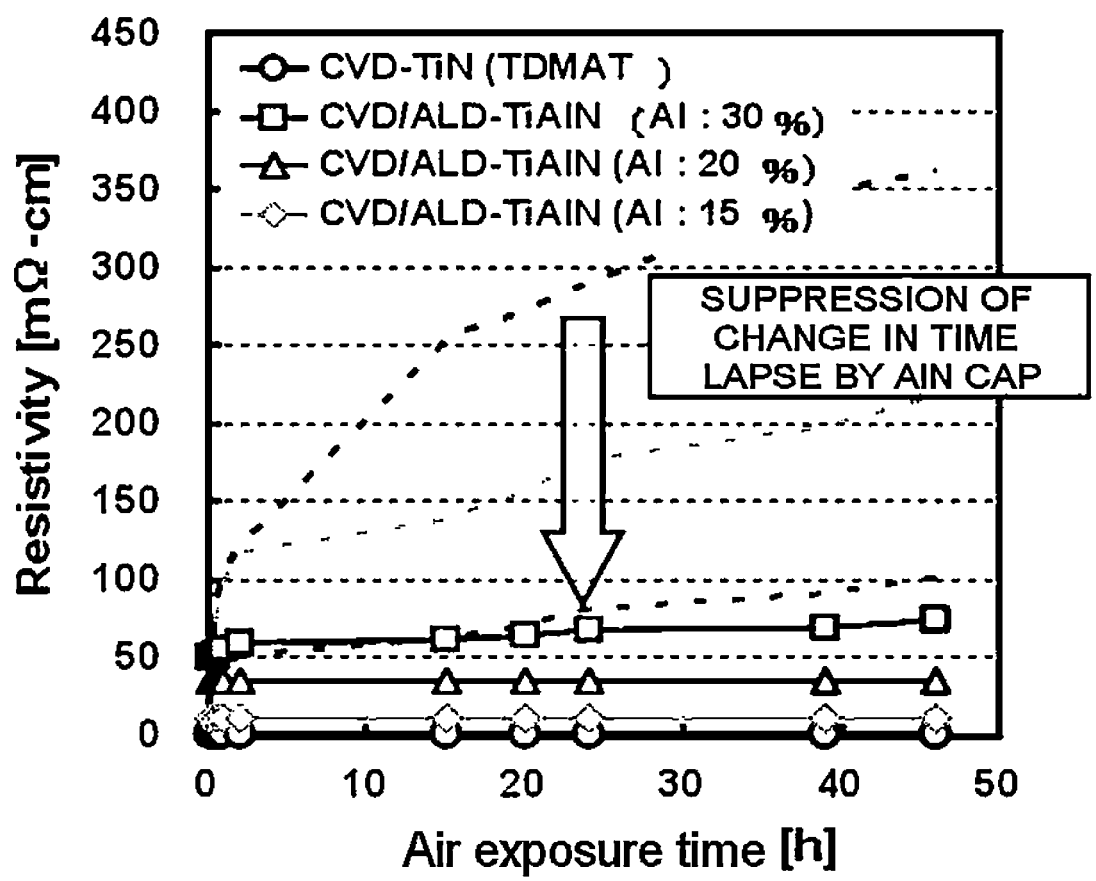
FIG. 7b illustrates dependencies of resistivities of the TiN film and the TiAlN film on air exposure time when the AlN film, which is the anti-oxidation layer, is formed on the TiN film and the TiAlN film.

FIG. 7b illustrates the dependency of the resistivities of a TiN film and a TiAlN film on the air exposure time when the AlN film is formed as the anti-oxidation layer on the TiN film and the TiAlN film (hereinafter, referred to as "with AlN cap"). In FIG. 7b, the horizontal axis represents the air exposure time (time period during which the TiN film and the TiAlN film are exposed to atmosphere) of the TiN film and the TiAlN film when there is an AlN cap, and the vertical axis represents electric resistivities of the TiN film and the TiAlN film. The mark "○" in the drawing represents the electric resistivity of the TiN film having 0% Al content when there is an AlN cap. The mark "□" in the drawing represents the electric resistivity of the TiAlN film having 30% Al content when there is an AlN cap. The mark "Δ" in the drawing represents the electric resistivity of the TiAlN film having 20% Al content when there is an AlN cap. The mark "◇" in the drawing represents the electric resistivity of the TiAlN film having 15% Al content when there is an AlN cap.

As shown in FIG. 7a, the resistivity of the TiN film drastically increases with a lapse of the air exposure time when there is no AlN cap. On the other hand, the resistivity of the TiAlN film without AlN cap also increases with the lapse of the air exposure time although the resistivity thereof differs according to the Al content of the TiAlN film. That is, when there is no AlN cap, the resistivities of both of the TiN film and the TiAlN film increase and the TiN film and the TiAlN film are easily oxidized with the lapse of the air exposure time. In this regard, as shown in FIG. 7b, neither the TiN film nor the TiAlN film have increased resistivity and are not easily oxidized with the lapse of the air exposure time when there was an AlN cap. From these results, it can be confirmed that the AlN film serves as an oxygen blocking layer that prevents oxygen in the air from penetrating into the TiN film or the TiAlN film.

When the AlN film, i.e. the AlN cap, is not formed on the surface of the TiN film or the TiAlN film, the oxygen in the air easily penetrates into the TiN film or the TiAlN film. As a result, the TiN film or the TiAlN film is easily oxidized. When a large amount of oxygen is present in a gate electrode, i.e., a metal gate electrode, which includes the TiN film or the TiAlN film, the oxygen in the metal gate electrode penetrates through the high-k film such as the HfSiON film, which is an underlying film, and diffuses into the interfacing layer such as the SiON film or the $SiO_2$ film in case that the metal gate electrode was subjected to a high-temperature heat treatment. As a result, an increase in the EOT leads to an increase in the difficulty in scaling of a transistor. In this regard, this problem may be solved by forming the AlN film, i.e. the AlN cap on the metal gate electrode. Such configuration will be described in detail in second example.

Second Example

In accordance with the second example of the present invention, the cross-sectional TEM image analyses in case the AlN film is formed as the anti-oxidation layer on the TiN film (there is an AlN cap), and in case the AlN film is not formed on the TiN film (there is no AlN cap) in a gate stack manufactured in a gate-first process, will be described in detail. An evaluation sample having the AlN cap was manufactured by forming the SiON film, which is the interfacing layer, on a silicon wafer, forming the HfSiON film, which is the high-k gate insulating film, on the SiON film, forming the TiN film, which is the metal gate electrode, on the HfSiON film, forming the AlN film, which is the anti-oxidation layer, on the TiN film, and forming the W film on the AlN film. An evaluation sample having without AlN cap was manufactured by forming the SiON film, which is the interfacing layer, on the silicon wafer, forming the HfSiON film, which is the high-k gate insulating film, on the SiON film, forming the TiN film, which is the metal gate electrode, on the HfSiON film, and forming the W film on the TiN film. Both of the evaluation samples were subjected to the activation annealing (spike) at 1000° C. after forming the gate stack.

FIG. 8 is a diagram illustrating TEM images of a cross-section of a gate stack manufactured in a gate-first process in accordance with the second example. FIG. 8a illustrates a TEM image of a cross-section of an evaluation sample wherein the SiON film, the HfSiON film, the CVD-TiN film, the AlN film (3 nm) and the W film are sequentially formed on the wafer, and the activation annealing is performed. FIG. 8b illustrates a TEM image of a cross-section of an evaluation sample wherein the SiON film, the HfSiON film, the CVD-TiN film, the AlN film (5 nm) and the W film are sequentially formed on the wafer, and the activation annealing is performed. FIG. 8c illustrates a TEM image of a cross-section of an evaluation sample wherein the SiON film, the HfSiON film, a PVD-TiN film and the W film are sequentially formed on the wafer, and the activation annealing is performed, and FIG. 8d illustrates a TEM image of a cross-section of an evaluation sample wherein the SiON film, the HfSiON film, the CVD-TiN film and the W film formed on the wafer, and the activation annealing is performed. The AlN film was formed in the same manner as in the above-described embodiment using the ALD method. The TiN film was formed in the same manner as in the above-described embodiment using the CVD method. Both of the films were formed using the substrate processing apparatus according to the above-described embodiments. In addition, the processing conditions used herein were set to be within the processing conditions described in the above-described embodiments. In addition, the SiON film and the HfSiON film were formed by a conventional CVD method, and the PVD-TiN film and the W film were formed by a conventional PVD method. The $SiO_2$ film may be used as the interfacing layer in place of the SiON film. In addition, the high-k insulating film such as the HfSiO film, the HfO film, the HfON film, the HfAlO film or the HfLaO film may be used as the high-k gate insulating film in place of the HfSiON film.

Figure 8A:
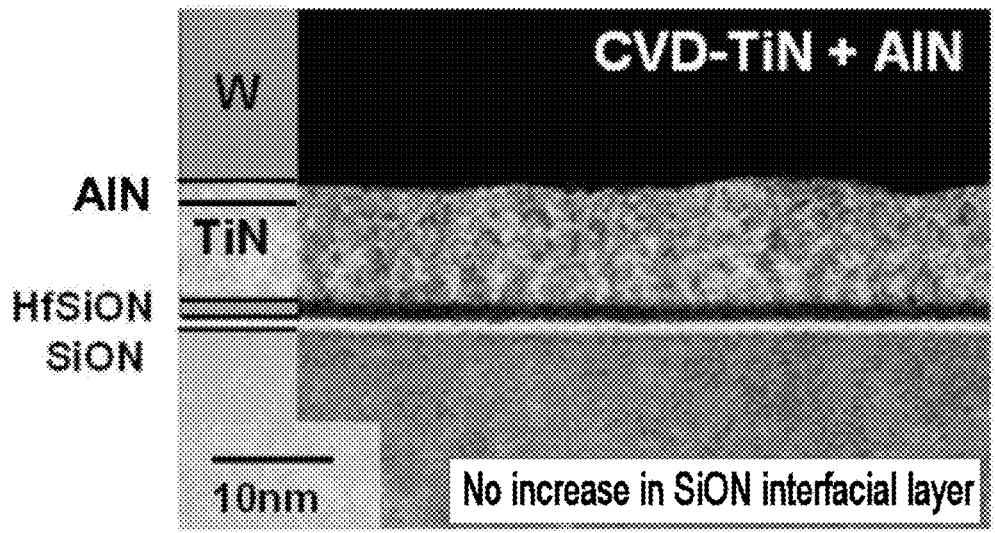
FIG. 8a illustrates a TEM image of a cross-section of a sample including a SiON film, a HfSiON film, a CVD-TiN film, an AlN film (3 nm) and a W film formed on a wafer.
Figure 8B:
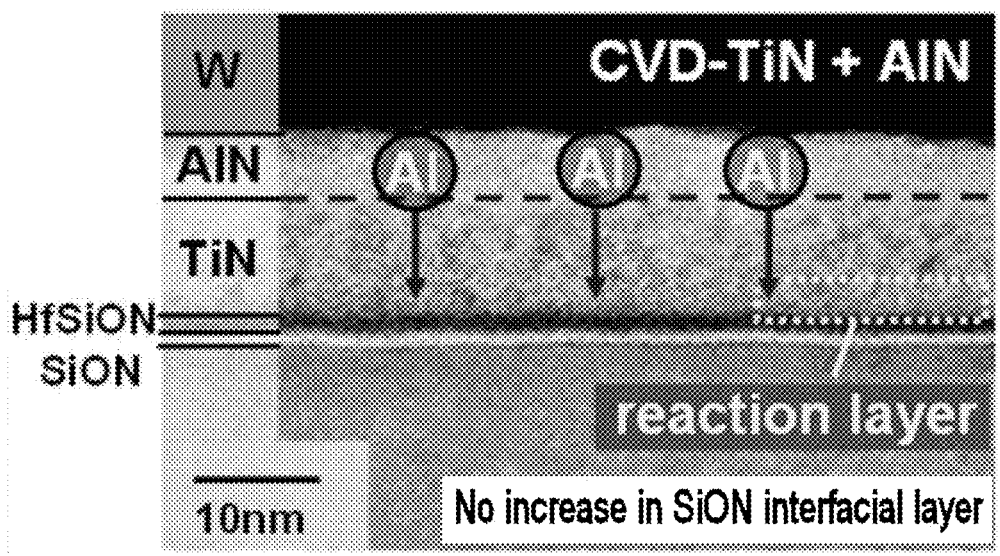
FIG. 8b illustrates a TEM image of a cross-section of a sample including the SiON film, the HfSiON film, the CVD-TiN film, an AlN film (5 nm) and the W film formed on the wafer.
Figure 8C:
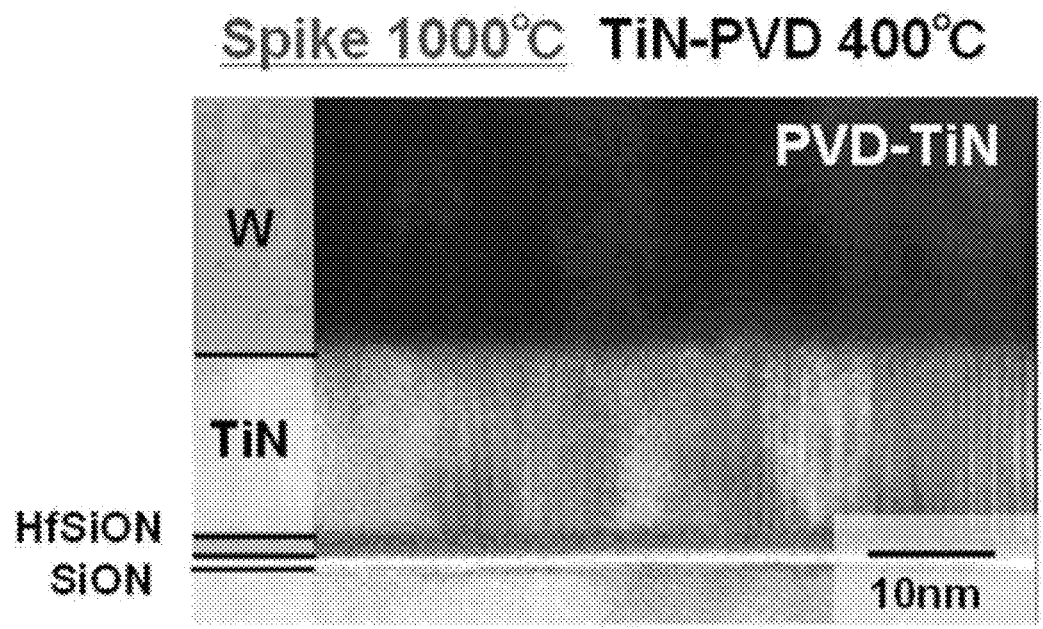
FIG. 8c illustrates a TEM image of a cross-section of a sample including the SiON film, the HfSiON film, a PVD-TiN film and the W film formed on the wafer.
Figure 8D:
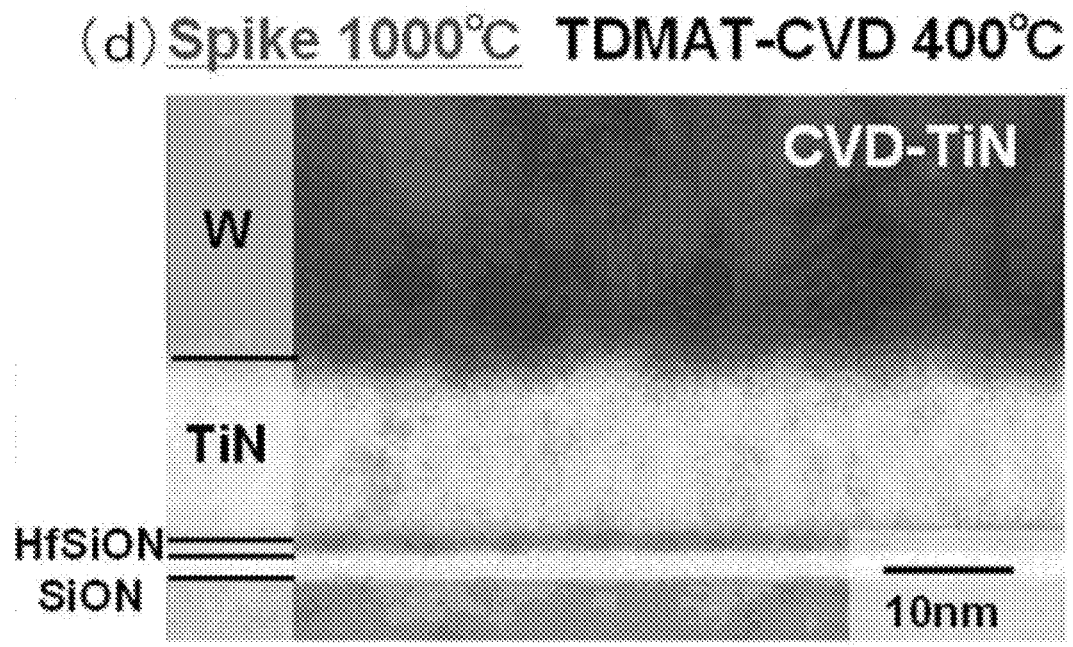
FIG. 8d illustrates a TEM image of a cross-section of a sample including the SiON film, the HfSiON film, the CVD-TiN film and the W film formed on the wafer.

When there is the AlN cap such as a CVD-TiN/AlN structure as shown in FIGS. 8a and 8b, a thickness of the SiON film, which is the interfacing layer, did not increase. That is, a case where there is the AlN cap as shown in FIGS. 8a and 8b is equivalent to a case where the PVD-TiN film (an oxygen-free TiN film) is used shown in FIG. 8c. On the other hand, when the CVD-TiN film having without AlN cap is used as shown in FIG. 8d, the thickness of the SiON film, which is the interfacing layer, increased. From these results, the anti-oxidation effect on the TiN film by the AlN film, i.e. the AlN cap, is confirmed and the increase in EOT may be suppressed even in the actual gate stack.

Third Example

Figure 9A:
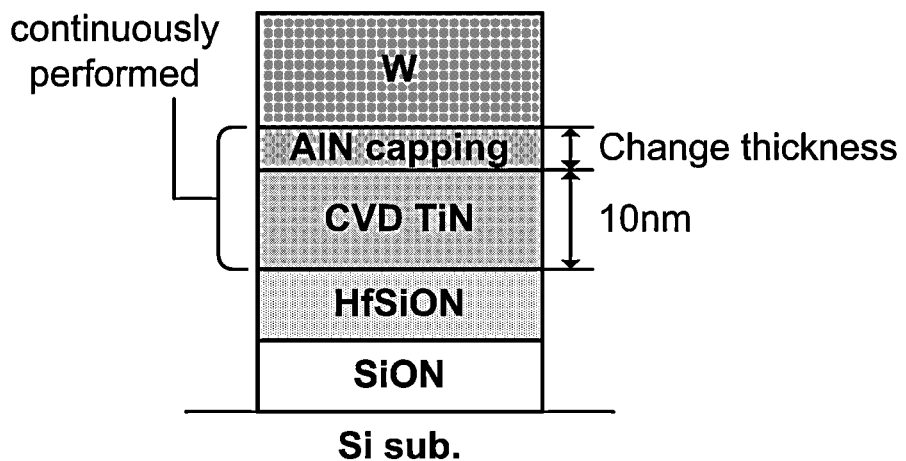
FIG. 9a illustrates a structure of an evaluated sample.
Figure 9B:
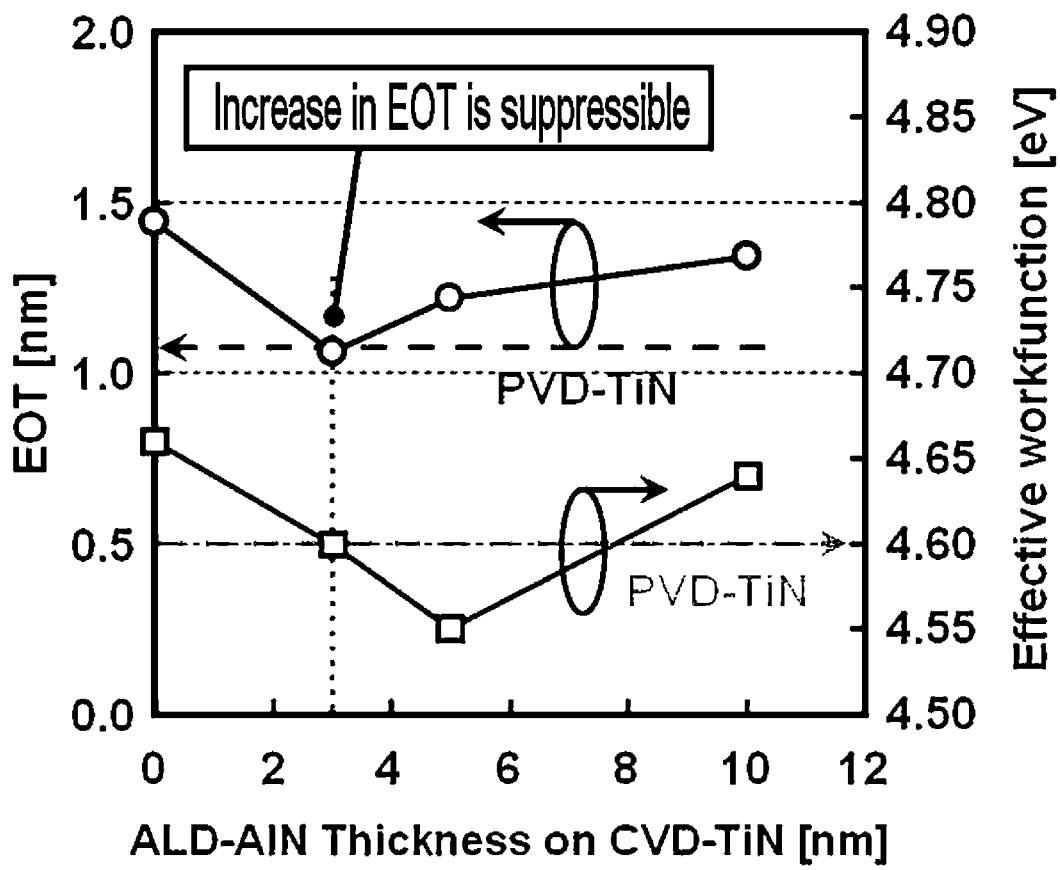
FIG. 9b illustrates the dependency of the thickness of the AlN film on the EOT and the effective work function.

In accordance with the third example of the present invention, a dependency of an EOT and an effective work function in the gate stack manufactured in the gate-first process on a thickness of the AlN film, which is the anti-oxidation layer will be described in detail. FIG. 9a illustrates a structure of an evaluation sample. The evaluation sample was manufactured by forming the SiON film, which is the interfacing layer on the silicon wafer (Si sub.), forming the HfSiON film, which is the high-k gate insulating film, on the SiON film, forming a 10 nm-thick CVD-TiN film, which is the metal gate electrode, on the HfSiON film, forming the AlN film (AlN capping), which is the anti-oxidation layer, on the CVD-TiN film, forming the W film on the AlN film, and subjecting the silicon wafer to activation annealing (spike) at 1000° C. The AlN film was formed in the same manner as in the above-described embodiment using the ALD method. The TiN film was formed in the same manner as in the above-described embodiment using the CVD method. Both of the films were formed using the substrate processing apparatus according to the above-described embodiments. In addition, the processing conditions used herein were set to be within the processing conditions described in the above-described embodiments. In addition, the SiON film and the HfSiON film were formed by the conventional CVD method. The W film was formed by the conventional PVD method. The $SiO_2$ film may be used as the interfacing layer in place of the SiON film. In addition, the high-k insulating film such as the HfSiO film, the HfO film, the HfON film, the HfAlO film or the HfLaO film may be used as the high-k gate insulating film in place of the HfSiON film. FIG. 9b illustrates the dependency of the EOT and the effective work function on the thickness of the AlN film. In FIG. 9b, the horizontal axis represents the thickness of the AlN film, and the left vertical axis represents the EOT and the right vertical axis represents the effective work function. Marks "○" and "□" in the drawing represent the EOT and the effective work function, respectively. In accordance with third example, four evaluation samples wherein the thickness of the AlN film 0 nm, 3 nm, 5 nm and 10 nm were prepared. "Thickness of the AlN film is 0 nm" means "without AlN cap". In addition, the effective work function represents data obtained after the activation annealing (spike) at 1000° C.

As shown in FIG. 9b, in the case where there is AlN cap, the EOT when the thickness of the AlN film is 10 nm or less is lower compared to the case where there is no AlN cap (the thickness of the AlN film is 0 nm). The EOT when the thickness of the AlN film is 5 nm is lower than the EOT when the thickness of the AlN film is 10 nm, and the EOT when the thickness of the AlN film is 3 nm is lower than the EOT when the thickness of the AlN film is 5 nm. In addition, the EOT when the thickness of the AlN film is 3 nm is identical to the EOT when the PVD-TiN film is used, and its effective work function is identical to the effective work function when of the PVD-TiN film is used. When the thickness of the AlN film is more than 3 nm, the EOT is lower compared to the case where there is no AlN cap although the EOT increases. This is presumed to be caused by Al diffusing into the TiN electrode as the thickness of the AlN film increases.

Regarding the decrease in the EOT, the thickness of the AlN film, which is the anti-oxidation layer, is preferably set to 10 nm or less. More specifically, the thickness of the AlN film, which is the anti-oxidation layer, is preferably 3 nm or more and 10 nm or less, and more preferably, 3 nm or more and 5 nm or less. Regarding the decrease in EOT and an improvement of the effective work function, it is preferable that the thickness of the AlN film, which is the anti-oxidation layer, is approximately 3 nm. In this case, the thickness of 3 nm of the AlN film means a thickness which can obtain the EOT and the effective work function equivalent to the EOT and the effective work function that can be obtained from the TiN film having a thickness of 10 nm equivalent to that of the CVD-TiN film, which is formed by the PVD method, i.e. a physical deposition method.

Fourth Example

Figure 10:
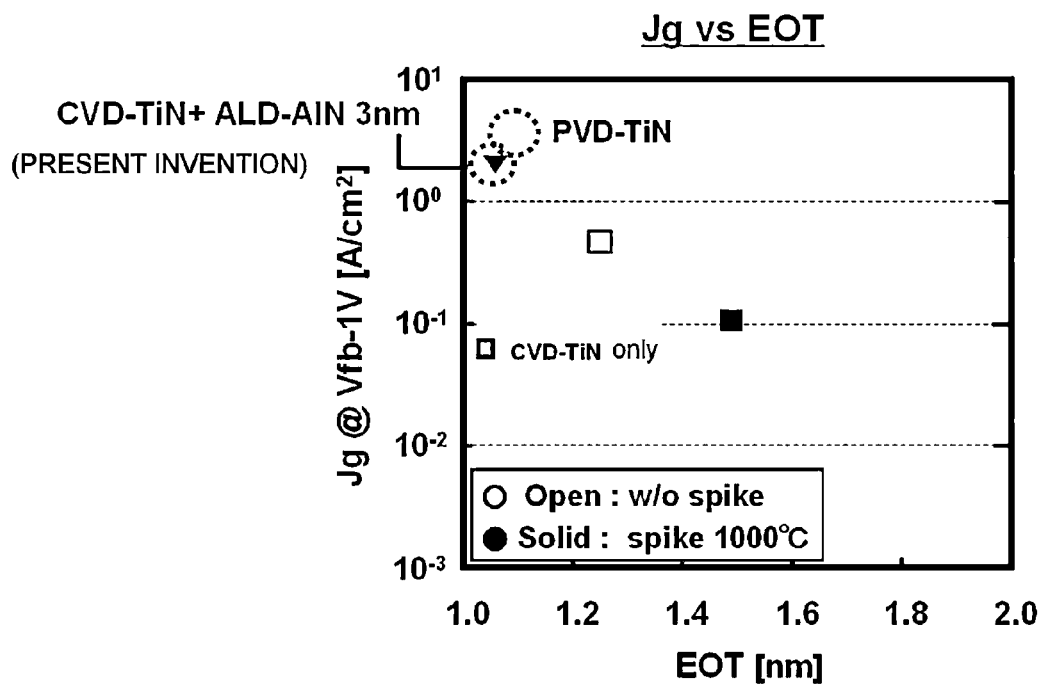
FIG. 10 is a diagram illustrating a relationship between a leakage current and EOT in a gate stack manufactured in a gate-first process in accordance with a fourth example.

In accordance with the fourth example of the present invention, a relationship between a leakage current and the EOT in the gate stack manufactured in the gate-first process will be described in detail. Evaluation sample same as that of the second example is used in the fourth example. FIG. 10 is a diagram illustrating the relationship between the leakage current and the EOT. In FIG. 10, a horizontal axis represents the EOT, and a vertical axis represents the leakage current. In the drawing, mark "▼" represents a results of the evaluation sample having the CVD-TiN/AlN structure (with AlN cap), mark "○" represents a results of the evaluation sample having the PVD-TiN structure (without AlN cap), and the mark "□" represents a results of the evaluation sample having the CVD-TiN structure (without AlN cap).

As shown in FIG. 10, the EOT of the CVD-TiN/AlN structure (with AlN cap) was lower than that of the PVD-TiN structure (without AlN cap) or the CVD-TiN structure (without AlN cap). In addition, the leakage current of the CVD-TiN/AlN structure (with AlN cap) was identical to or lower than that of the PVD-TiN structure (without AlN cap). That is, by depositing the anti-oxidation layer (oxygen blocking layer) such as the AlN cap layer on the surface of the metal film, the CVD metal film such as the CVD-TiN film, which is easily oxidized, has characteristic identical to or better than that of the PVD metal film, i.e. the metal film formed by the PVD method.

<Preferred Embodiment of the Present Invention>

Hereinafter, preferred embodiment of the present invention will now be described in more detail.

According to an embodiment of the present invention, there is provided a method of manufacturing a semiconductor device, including:

(a) loading a substrate into a processing container;
(b) forming a metal film on the substrate using a chemical deposition method by supplying a processing gas into the processing container and exhausting the processing gas;
(c) forming an aluminum nitride film on the metal film using the chemical deposition method by supplying an aluminum-containing source gas and a nitrogen-containing gas into the processing container and exhausting the aluminum-containing source gas and the nitrogen-containing gas; and
(d) unloading the substrate from the processing container after forming the metal film and the aluminum nitride film,
wherein the step (b) and the step (c) are continuously performed while maintaining an inside of the processing container to have an oxygen-free atmosphere.

Preferably, a thickness of the aluminum nitride film is 10 nm or less.

Preferably, a thickness of the aluminum nitride film ranges from 3 nm to 10 nm.

Preferably, a thickness of the aluminum nitride film ranges from 3 nm to 5 nm.

Preferably, a thickness of the aluminum nitride film is 3 nm.

Preferably, the aluminum nitride film is formed so as to cover an entire surface of the metal film.

Preferably, the metal film is formed by one of a CVD method or an ALD method.

Preferably, the metal film includes a titanium.

Preferably, the metal film includes a titanium and a nitrogen.

Preferably, the metal film includes one of a titanium nitride film and a titanium aluminum nitride film.

Preferably, the metal film may be a titanium nitride film or a titanium aluminum nitride film.

Preferably, the metal film includes a titanium nitride film, and the titanium nitride film is formed by one of a CVD method and an ALD method using a titanium-containing source gas and the nitrogen-containing gas as the processing gas.

Preferably, the metal film includes a titanium aluminum nitride film, and the titanium aluminum nitride film is formed by one of a CVD method and an ALD method using a titanium-containing source gas, the aluminum-containing source gas and the nitrogen-containing gas as the processing gas.

Preferably, the aluminum nitride film is formed by the ALD method using the aluminum-containing source gas and the nitrogen-containing gas.

Preferably, the titanium nitride film or the titanium aluminum nitride film and the aluminum nitride film are formed while a temperature of the substrate is maintained.

According to another embodiment of the present invention, there is provided a method of processing a substrate, including:

(a) loading a substrate into a processing container;
(b) forming a metal film on the substrate using a chemical deposition method by supplying a processing gas into the processing container and exhausting the processing gas;
(c) forming an aluminum nitride film on the metal film using the chemical deposition method by supplying an aluminum-containing source gas and a nitrogen-containing gas into the processing container and exhausting the aluminum-containing source gas and the nitrogen-containing gas; and
(d) unloading the substrate from the processing container after forming the metal film and the aluminum nitride film,
wherein the step (b) and the step (c) are continuously performed while maintaining an inside of the processing container to have an oxygen-free atmosphere.

According to still another embodiment of the present invention, there is provided a method of processing a substrate, including:

(a) loading a substrate into a processing container;
(b) forming a titanium nitride film on the substrate using a chemical deposition method by supplying a source gas containing a titanium and a nitrogen-containing gas into the processing container and exhausting the source gas containing the titanium and the nitrogen-containing gas from the processing container;
(c) forming an aluminum nitride film on the titanium nitride film using the chemical deposition method by supplying an aluminum-containing source gas and the nitrogen-containing gas into the processing container and exhausting the aluminum-containing source gas and the nitrogen-containing gas from the processing container; and
(d) unloading the substrate from the processing container after forming the titanium nitride film and the aluminum nitride film,
wherein the step (b) and the step (c) are continuously performed while maintaining an inside the processing container to have an oxygen-free atmosphere.

According to yet another embodiment of the present invention, there is provided a method of processing a substrate, including:

(a) loading a substrate into a processing container;
(b) forming a titanium nitride film on the substrate using a CVD method by supplying a source gas containing a titanium and a nitrogen-containing gas into the processing container and exhausting the source gas containing the titanium and the nitrogen-containing gas from the processing container;
(c) forming an aluminum nitride film on the titanium nitride film using an ALD method by supplying a source gas containing an aluminum and the nitrogen-containing gas into the processing container and exhausting the source gas containing the aluminum and the nitrogen-containing gas from the processing container; and
(d) unloading the substrate from the processing container after forming the titanium nitride film and the aluminum nitride film,
wherein the step (b) and the step (c) are continuously performed while maintaining an inside the processing container to have an oxygen-free atmosphere.

According to yet another embodiment of the present invention, there is provided a substrate processing apparatus including:

a processing container for processing a substrate;

a processing gas supply system for supplying a processing gas into the processing container;

an aluminum source gas supply system for supplying an aluminum-containing source gas into the processing container;

a nitrogen-containing gas supply system for supplying a nitrogen-containing gas into the processing container;

an exhaust system for exhausting an inside of the processing container; and a control unit for controlling the processing gas supply system, the aluminum source gas supply system, the nitrogen-containing gas supply system and the exhaust system so as to continuously perform: forming a metal film on the substrate using a chemical deposition method by supplying the processing gas into the processing container and exhausting the processing gas; and forming an aluminum nitride film on the metal film using the chemical deposition method by supplying the aluminum-containing source gas and the nitrogen-containing gas into the processing container and exhausting the aluminum-containing source gas and the nitrogen-containing gas while maintaining the inside of the processing container have an oxygen-free atmosphere.

What is claimed is:

1. A method of manufacturing a semiconductor device, comprising:
   (a) loading a substrate into a processing container;
   (b) forming a metal film including a titanium aluminum nitride film on the substrate using a chemical deposition method by supplying a processing gas into the processing container and exhausting the processing gas;
   (c) forming an aluminum nitride film on the metal film using the chemical deposition method by supplying an aluminum-containing source gas and a nitrogen-containing gas into the processing container and exhausting the aluminum-containing source gas and the nitrogen-containing gas; and
   (d) unloading the substrate from the processing container after forming the metal film and the aluminum nitride film,
   wherein the step (b) and the step (c) are continuously performed while maintaining an inside of the processing container to have an oxygen-free atmosphere;
   (e) exposing the metal film by etching the aluminum nitride film under an oxygen-free atmosphere; and
   (f) forming an upper film including a metal on the metal film after performing the step (e),
   wherein the step (b) comprises forming the titanium aluminum nitride film by one of a chemical vapor deposition method and an atomic layer deposition method using a titanium-containing source gas, the aluminum-containing source gas and the nitrogen-containing gas,
   wherein the step (c) comprises forming the aluminum nitride film by the atomic layer deposition method using the aluminum-containing source gas and the nitrogen-containing gas, and
   wherein the step (e) and the step (f) are continuously performed under the oxygen-free atmosphere.

2. The method according to claim 1, wherein a thickness of the aluminum nitride film is 10 nm or less.

3. The method according to claim 1, wherein a thickness of the aluminum nitride film ranges from 3 nm to 10 nm.

4. The method according to claim 1, wherein a thickness of the aluminum nitride film ranges from 3 nm to 5 nm.

5. The method according to claim 1, wherein a thickness of the aluminum nitride film is 3 nm.

6. The method according to claim 1, wherein the aluminum nitride film is formed so as to cover an entire surface of the metal film.

7. The method according to claim 1, wherein the metal film and the aluminum nitride film are formed while a temperature of the substrate is maintained.

8. The method according to claim 1, wherein the titanium aluminum nitride film and the aluminum nitride film are formed while a temperature of the substrate is maintained.

* * * * *